United States Patent [19]
Horiuchi et al.

[11] Patent Number: 5,638,066
[45] Date of Patent: Jun. 10, 1997

[54] EFFICIENT PACKED ENCODING METHOD FOR ASN.1

[75] Inventors: Hiroki Horiuchi, Okegawa; Sadao Obana, Toda; Kenji Suzuki, Komae, all of Japan

[73] Assignee: Kokusai Denshin Denwa Co., Ltd., Tokyo, Japan

[21] Appl. No.: 399,217

[22] Filed: Mar. 6, 1995

[30] Foreign Application Priority Data

Jul. 7, 1994 [JP] Japan .................. 6-155772

[51] Int. Cl.⁶ .................. G06F 5/00; H04L 23/00
[52] U.S. Cl. .................. 341/60; 341/67; 370/476
[58] Field of Search .................. 341/60, 67, 63, 341/50, 55; 370/60, 60.1, 85.1–85.15, 94.1–94.2, 92, 99, 102, 110.1

[56] References Cited

U.S. PATENT DOCUMENTS 5,418,972  5/1995  Takeuchi et al. .................. 395/800

Primary Examiner—Jeffrey A. Gaffin
Assistant Examiner—Peguy Jean Pierre

[57] ABSTRACT

An efficient packed encoding rules (EPER) for ASN.1 for efficiently encoding the value to each type of abstract syntax definition, in which structure of an encoding data is divided into three fields of a bit field, an octet field following the bit field, and an offset field selectively added to before the bit field, in the bit field, bit data is set in the order of the abstract syntax definition, in the octet field, octet data in a unit of octet is set in the order of the abstract syntax definition, in the offset field, a length information of bit field is set and, in the bit field, padding is made so that a total length of the offset field and the bit field is an integer multiple of 8 bits, and the offset field is added when the length of bit field is not determined from the abstract syntax definition, thereby eliminating problems of PER.

20 Claims, 13 Drawing Sheets

Flow chart of encoding method

Structure of encoding data of the present invention

Encoding of Integer ($-32 \leq $ Value $\leq 31$)

Encoding of Integer ($-2^{35} \leq$ Value $\leq 2^{35}-1$)

Encoding of Integer ($-2^{67} \leq$ Value $\leq 2^{67}-1$)

Encoding of Integer ($-2^{(40 \times 8 + 4)} \leq$ Value $\leq 2^{(40 \times 8 + 4)} - 1$)

Encoding of Integer $\begin{pmatrix} \text{Value} \leq -2^{(40 \times 8 + 4)} - 1 \\ \text{or } 2^{(40 \times 8 + 4)} \leq \text{Value} \end{pmatrix}$ Flow chart of encoding method

FIG. 9

Abstract syntax example

Employees::= SEQUENCE OF PersonalRecord
PersonalRecord::=SEQUENCE {
　number INTEGER, sex ENUMERATED {male (0), female (1)},
　age INTEGER, firstName PrintableString, lastName
　PrintableString, single Boolean, children ChildInformation
　OPTIONAL}
ChildInformation:: = SEQUENCE OF SEQUENCE{
　firstName PrintableString, age INTEGER}

FIG. 10

Value setting example

{{number 1, sex male(0), age 30, firstName "Taro", lastName
"Yamada", single FALSE, children {{firstName "Jiro", age 3}}
　}
　{number 2, sex female(1), age 25, firstName "Hana"
　　lastName "Sato", single TRUE
　}
}

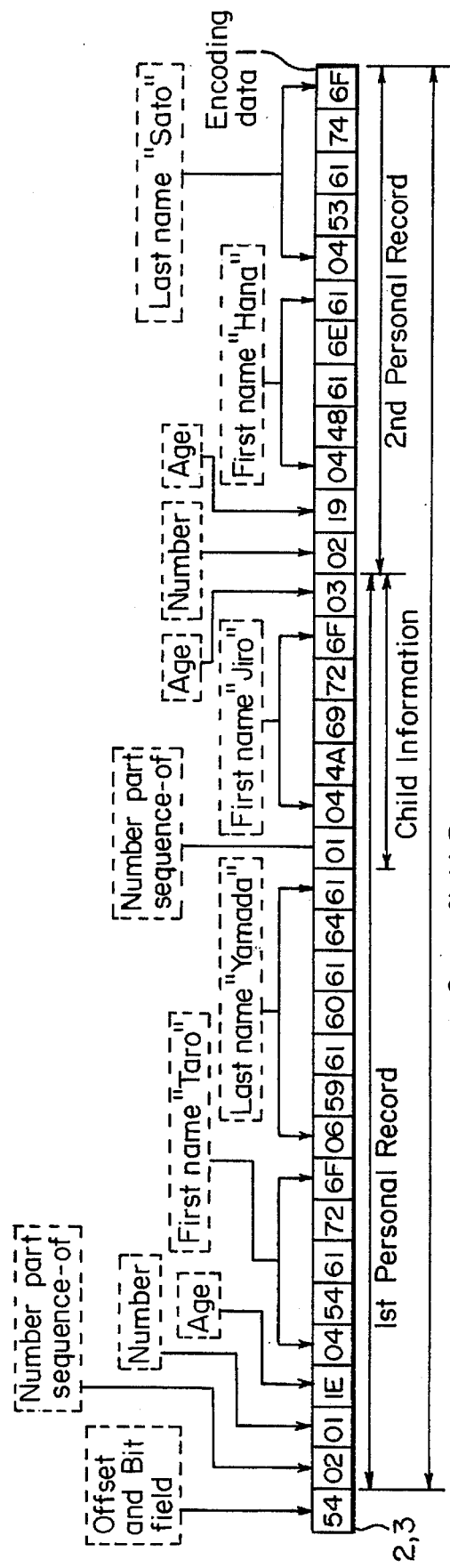
FIG. 11 Encoding example

FIG. 12

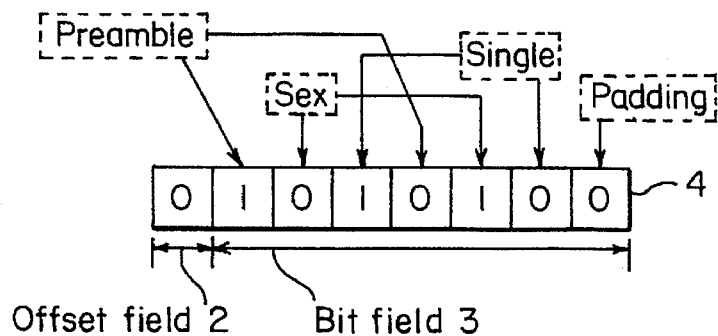

FIG. 13  Abstract syntax definition used in evaluation experiment

Example 1 ::= SEQUENCE OF SEQUENCE {a BOOLEAN,
b INTEGER}

FIG. 14  Abstract syntax definition used in evaluation experiment

Example 2 ::= SEQUENCE OF SEQUENCE {a BOOLEAN,
b OctetString}

FIG. 15  Abstract syntax definition example

A ::= SEQUENCE {
a [1] INTEGER OPTIONAL, b [2] BOOLEAN OPTIONAL,
c [3] INTEGER OPTIONAL, d [4] BOOLEAN OPTIONAL}

FIG. 16  Input value example

{a 1, b TRUE, C 2, d FALSE}

Encoding data of PER (for transfer syntax Aligned)

Encoding data of the present invention

Encoding example using sub-type

Encoding example using sub-type

Abstract syntax
A::=INTEGER (1..1)

Note 1: R = 1 (fixed value)
Note 2: not encoded.

Encoding example using sub-type

Encoding example using sub-type

Encoding example using sub-type

Note 1: R = 1 (fixed size)

Note 2: Offset field and bit field are not encoded.

Encoding example using sub-type

Note 1: R = 2

Note 2: Offset field is not encoded.

Encoding example using sub-type

Note 1: R = 1

Note 2: 8 = 8 x 1 + 0

Note 3: Offset field and bit field are not encoded

Encoding example using sub-type

Note 1: R = 1

Note 2: 1 < 8

Note 3: Offset field and octet field are not encoded.

FIG. 27    Encoding example using sub-type

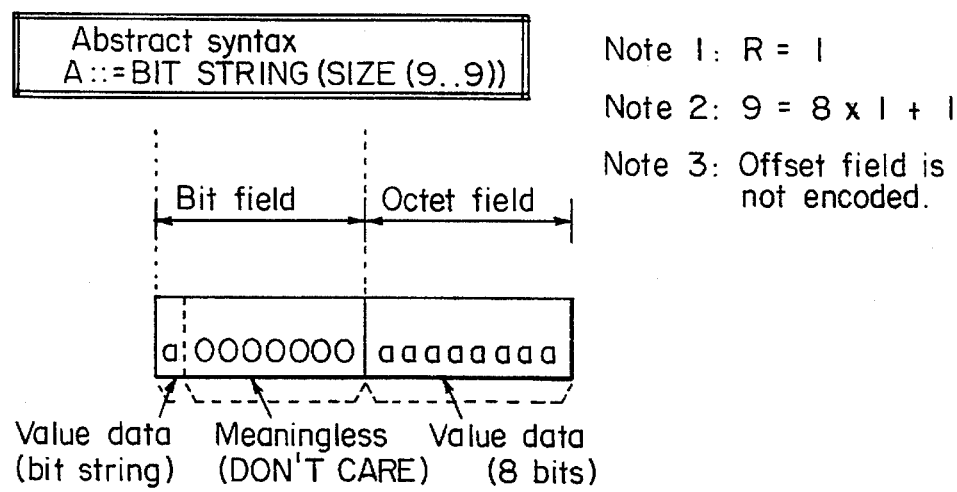

Note 1: R = 1
Note 2: 9 = 8 x 1 + 1
Note 3: Offset field is not encoded.

FIG. 28    Encoding example using sub-type

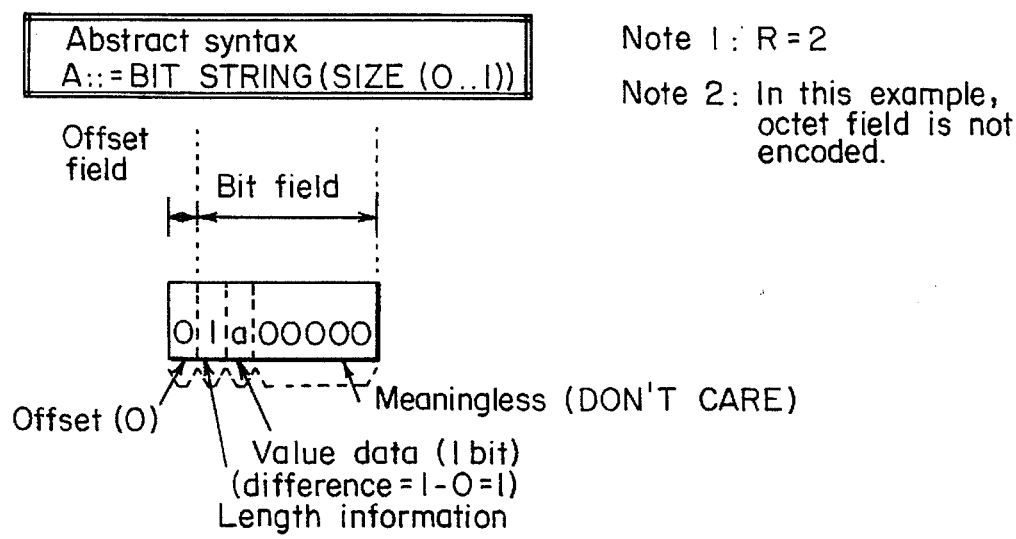

Note 1: R = 2
Note 2: In this example, octet field is not encoded.

FIG. 29
Abstract syntax used in evaluation test

Eg1::= SEQUENCE OF SEQUENCE {
    first INTEGER, second IA5String, third INTEGER}
Eg2::= SEQUENCE SIZE (20) OF SEQUENCE {
    first INTEGER (0..128), second IA5String (16),
    third INTEGER (32)}

EFFICIENT PACKED ENCODING METHOD FOR ASN.1

FIELD OF THE INVENTION

This invention relates to an efficient packed encoding rules (EPER) for ASN.1 which is a type of format description language.

Here, as well known, ASN.1 is an abbreviation of the Abstract Syntax Notation One (ISO/IEC 8824:1990, "Information Technology-Open Systems Interconnection-Specification of Abstract Syntax Notation One" (ASN.1) specified as international standard, which is used in data communications for description of data types such as OSI (Open System Interconnection) and ISDN (Integrated Services for Digital Network).

DESCRIPTION OF PRIOR ART

In general, format of data elements in OSI upper layer protocols, a user part of ISDN, or the like is specified by the abstract syntax using ASN.1. Data type in ASN.1 includes Boolean type, Enumerated type, Null type, Integer type, Real type, Octet String type, Character String type, Bit String type, Object Identifier type, Any type, Sequence type, Set type, Choice type, Sequence-Of type, Set-Of type, and the like.

Data element is transmitted to the communication line by encoding the "value" set according to the individual "type" of the abstract syntax definition described in ASN.1 to the octet string using the ASN.1 encoding rules.

<Basic Encoding Rules (BER)>

At present, as an international standard for ASN.1 encoding rules, as well known, Basic Encoding Rules (ISO/IEC 8825, "Information Technology-Open Systems Interconnection-Specification of Basic Encoding Rules for Abstract Syntax Notation One" (ASN.1), abbreviated as BER, are specified and widely used.

In the Basic Encoding Rules (BER), each "encoding" of each type is always provided with identifier octets (ID), which are octet string for identifying the "type" of the value, and length information octets (LI), which are octet string indicating the length of the value (bit length and octet length).

<Packed Encoding Rules (PER)>

The Basic Encoding Rules (BER) is redundant in that the length information octets (LI) and the identifier octets (ID) for the type are always added in encoded octet string. Then, in order to improve this, Packed Encoding Rules, abbreviated as PER, (ISO/IEC DIS 8825-2 "Specification of ASN.1 Encoding Rules-Part-2: Packed Encoding Rules" May 1994) have been developed by ISO.

The Packed Encoding Rules (PER) for ASN.1 have the following features.

(1) The identifier octets (ID) for the type are not added.
(2) The length information octets (LI) are added in octet string only when the value has a variable length.
(3) Encoding of Boolean type or Bit type is made on a bit unit (bit data).
(4) Encoding is not distinguished between Sequence type and Set type.
(5) The use of an optional and default components in Sequence type and Set type is indicated by a bit. This bit is referred to as Preamble.
(6) The component selected in Choice type is indicated by bit string (bit data). The bit string is referred to as Index.
(7) Each component forming Set type is encoded in the order from smaller tag number (Canonical Order).
(8) When a constraint is added to the range of the value of Integer type, the number of repetition components of Sequence-Of type, Set-Of type, and the like, the encoding data length is reduced using the constraint.
(9) Transfer syntax includes two kinds: an Aligned transfer syntax, in which padding is made on the bit unit encoded data to set an octet boundary, and an Unaligned transfer syntax, in which no padding is made.

An example of PER will be described with reference to FIGS. 15 to 17. In this example, an Abstract Syntax definition (A) of Sequence type shown in FIG. 15 and setting example of value of each type shown in FIG. 16 are encoded as the Aligned transfer syntax using PER as shown in FIG. 17. As can be seen from FIG. 17, the preamble showing the use of optional components is encoded by four bits of the first octet, the value of Boolean type is set by each top bit of the fourth octet and the seventh octet, the value of Integer type is encoded by other octets, padding is made on the first, fourth, and seventh octets, and the total encoding data length is 7 octets (56 bits).

The prior art Packed Encoding Rules (PER) have problems as shown in (i) to (iv) below which have yet to be improved. (i) Increase in encoding and decoding time when using Unaligned transfer syntax:

Encoding data when using the Unaligned transfer syntax where no padding is made as a transfer syntax, depending on the type, contains bit data (data in units of bit) and octet data (data in units of octet).

Therefore, when an octet data exists following a bit data, the octet boundary is often not aligned in the octet data.

In this case, in a program for encoding and decoding of ASN.1, if the octet boundary is not aligned, frequent bit operation such as shift or logical AND must be made on the encoding data, which increases the processing time and decreases the processing speed. (ii) Increase in encoding data length when using Aligned transfer syntax:

In encoding data when using the Aligned transfer syntax where padding is made on bit data, the encoding data length is increased when a number of bit data components are included.

For example, in the encoding data example shown in FIG. 17, padding of the first, fourth, and seventh octets corresponding to the preamble and Boolean type is a total of 18 bits, which is about ⅓ of the total encoding data length.

In fact, in data elements of ordinary application layer protocol, since a number of optional components in Sequence type and Choice type are included, bit data such as preamble and index often occur in the encoding data by PER, resulting in an increased encoding data length due to padding. (iii) Redundancy of length information octets (LI) in encoding of Integer type:

Since the value has a variable length in Integer type, length information octets (LI) is added as octet data in encoding the value.

However, normally, since a small value is allocated to operation values of ROS (Remote operations) or error code in application layer protocol of OSI, the length information octets (LI) is always more than 1 octet even for a small value, which is redundant. (iv) Complexity of selecting transfer syntax of plural kinds:

Since two kinds of transfer syntax, Aligned and Unaligned, are defined, the transfer syntax must be selected depending on the communication partner, and such selection is tedious in application.

Therefore, a primary object of the present invention is to provide an efficient packed encoding method (EPEM) or an efficient packed encoding rules (EPER) which can solve the problems with the prior art Packed Encoding Rules (PER) for ASN.1.

SUMMARY OF THE INVENTION

In accordance with the present invention which attains the above object, there is provided an efficient packed encoding method for ASN.1 characterized in that: hereafter, the efficient. packed encoding method are referred to as EPER (the efficient packed encoding rules), structure of encoding data is divided into three fields of a bit field, an octet field following the bit field, and an offset field selectively added to before the bit field;

in the bit field, bit data is set in the order of abstract syntax definition;

in the octet field, octet data is set in the order of abstract syntax definition;

in the offset field, a length information of bit field is set and, in the bit field, padding is made so that a total length of the offset field and the bit field is an integer multiple of 8 bits; and the offset field is added when the length of bit field is not determined from the abstract syntax definition.

In particular, according to a second version of the present invention, EPER is characterized in that:

when the value in Integer type is within a range from $-32$ to 31, 2 bits are allocated to the length information, and the value is encoded with 1 octet including the length information to be set to the octet field; and when the value in Integer type is $-33$ or less or 32 or more, the value is encoded with 2 octets or more including the length information to be set to the octet field.

In a third version of the present invention, EPER is characterized in that:

when the value in Integer type is within a range from $-2^{35}$ to $-33$, and from 32 to $2^{35}-1$, the value is encoded with 2 to 5 octets including the length information; and when the value in Integer type is $-(2^{35}+1)$ or less and $2^{35}$ or more, the value is encoded with 6 octets including the length information.

In a fourth version of the present invention, EPER is characterized in that:

when a length of the value in BitString type is not an integer multiple of 8 bits, bit field is used for extra bits; and when the length of value in BitString type is an integer multiple of 8 bits and when the length of value in BitString type is not an integer multiple of 8 bits, octet field is used for a portion other than extra bits.

In a fifth version of the present invention, bit field is used for a preamble as to whether or not optional and default are used in Sequence type and Set type.

In a sixth version of the present invention, bit field is used for index showing components selected in Choice type.

In a seventh version of the present invention, offset field is added when the type is BitString type, and when an optional data bit is included in Sequence type and Set type, when a bit data is included in components in Choice type, and when the type of component in Sequence-Of type and Set-Of type is bit data.

In an eighth version of the present invention, EPER is characterized in that:

bit field is used in Boolean type, when the value in Enumerated type is within a range from 2 to 128, for extra bit. when the length of value in BitString type is not an integer multiple of 8 bits, for preamble of Sequence type and Set type, and when the index in Choice type is within a range from 2 to 128;

octet field is used when the value in Enumerated type is 129 or more, when the type is Integer type, Real type, OctetString type, CharacterString type, Object Identifier type, Any type, and BitString type in which the length of value is multiple of 8 bits, for a part other than extra bit when the length of value in BitString type is not an integer multiple of 8 bits, when the value is 129 or more in the index in Choice type, and for a number part showing the number of repetition components in Sequence-Of type and Set-Of type.

In a ninth version of the present invention, EPER is characterized in that:

when the total bit number of bit data is 1 bit to 7 bits, 1 bit is allocated to the offset field, and a specific bit data is set as a length information of the bit field;

when the total bit number of bit data is 0 bit and 1 octet to 63 octets, 1 octet is allocated to the offset field, a specific bit data is set to the first and second bit (2 bits) thereof as a length information of the bit field, and the octet number of bit field is set to the remaining 6 bits; and when the total bit number of bit data is 64 octets or more, 2 octets or more are allocated to the offset field, a specific bit data is set to the first and second bit (2 bits) of the first octet thereof, an octet number after the second octet is set to the remaining 6 bits, and octet number of the bit field is set to after the second octet.

Further, a tenth version of the present invention is an efficient packed encoding method for ASN.1 wherein the value of type is encoded according to a constraint defined by a sub-type.

An eleventh version of the present invention is characterized in that:

an object of encoding is a value of Integer type;

when the constraint constrains the value of Integer type to a single value, the value is not encoded; and when the constraint constrains the value of Integer type to a range including two or more values, a difference between a lower limit or an upper limit of the range and the value of Integer type is encoded.

A twelfth version of the present invention is characterized in that:

when only one of the upper limit or the lower limit of the range in the eleventh version is present but the other is not present, when the difference is 0 or more and 3 or less, 2 bits is allocated to the length information, and the difference is encoded with 1 octet including the 2 bits of the length information;

when the difference is 64 or more and $2^{36}-1$ or less, the difference is encoded with 2 to 5 octets including the length information; and when the difference is $2^{36}$ or more, the difference is encoded with 6 octets or more including the length information.

A thirteenth version of the present invention is characterized in that:

when both the upper limit value and the lower limit value are present in the range in the eleventh version, and the range includes 2 to $2^{16}$ kinds of values, when the range includes 2 to 128 kinds of values, the length information is not encoded, and only the difference is encoded with bit data and set to the bit field; and when the range includes 129 to $2^{16}$ kinds of values, the length information is not encoded, and only the difference is encoded with the octet data and set to the octet field.

A fourteenth version of the present invention is characterized in that:

when both the upper limit value and the lower limit value in the eleventh version are present, and the range includes more than $2^{16}$ kinds of values:

when the difference is 0 to 63, 2 bits is allocated to the length information, and the difference is encoded with 1 octet including the 2 bits of the length information;

when the difference is 64 to $2^{36}-1$, the difference is encoded with 2 to 5 octets including the length information; and when the difference is more than $2^{36}$, the difference is encoded with 6 or more octets including the length information.

A fifteenth version of the present invention is characterized in that:

the encoding object is a component data value of OctetString type;

when the constraint constrains the component data size of OctetString type to zero, the component data value and the length information are not encoded;

when the constraint constrains the component data size to a single size, only the component data value is encoded and set to the octet field, but the length information is not encoded;

when the constraint constrains the component data size to a range including two types to 128 kinds of size, the component data value is encoded and set to the octet field. a difference between the lower limit size or the upper limit size of the range and the component data size as length information is encoded with bit data and set to the bit field;

when the constraint constrains the component data size to a range including 129 or more kinds to less than $2^{16}$ kinds of size, the component data value is encoded and set to the octet field, and the difference between the lower limit or the upper limit of the range and the component data size as length information is encoded with octet data and set. to the octet field; and when the constraint constrains the component data size to a range including more than $2^{16}$ kinds of size, or a range where only the lower limit size is present and the upper limit size is not present. the component data value is encoded and set to the octet field, and the component data size as length information is encoded with octet data and set to the octet field.

A sixteenth version of the present invention is characterized in that:

the encoding object is a component data value of BitString type:

when the constraint constrains the component data size of BitString type to zero, the component data value and the length information are not encoded;

when the constraint constrains the component data size to a single size, only the component data size is encoded, but the length information is not encoded;

when the constraint constrains the component data size to a range including 2 to less than $2^{16}$ kinds of size, in addition to encoding the component data size, a difference between the lower limit size or the upper limit size and the component data size as length information is encoded; and when the constraint constrains the component data size to a range including $2^{16}$ or more kinds of size, or when only the lower limit size is present but the upper limit size is not present, in addition to encoding the component data value, the component data size itself as length information is encoded with octet data and set to the octet field.

A seventeenth version of the present invention is characterized in that:

in encoding of a component data value of BitString type, when the component data size is 8 or more bits and an integer multiple of 8, the component data value is set to the octet field;

when the component data size is less than 8 bits, the component data value is set to the bit field; and when the component data size is not an integer multiple of 8 exceeding 8 bits, of the component data value, a part which can be arranged in units of octet is set to the octet field, and a fraction in units of octet is set to the bit field.

An eighteenth version of the present invention is characterized in that:

in encoding the difference between the lower limit size or the upper limit size and the component data size in the range in the sixteenth version of the present invention;

when the range includes 2 to 128 kinds of size, the difference is encoded with bit data and set to the bit field; and when the range includes 129 to less than $2^{16}$ kinds of size, the difference is encoded with octet data and set to the octet field.

A nineteenth version of the present invention is characterized in that;

the encoding object is a component data of Sequence-Of type or Set-Of type; when the constraint constrains the component number to zero, the component and the number thereof are not encoded;

when the constraint constrains the component number to a single number, only the component is encoded according to PER of the type, but the component number is not encoded;

when the constraint constrains the component number to a range including 2 to less than $2^{16}$ kinds of number, the individual components are encoded according to PER of the individual types, and a difference between the lower limit number or the upper limit number and the component number of the range, in place of the component number, is encoded; and when the constraint constrains the component number to a range including $2^{16}$ of number, or a range where only the lower limit number is present but the upper limit number is not present, the individual components are encoded according to PER of the individual types, and the component number itself is encoded with octet data and set to the octet field.

A twentieth version of the present invention is characterized in that:

the difference between the lower limit number or the upper limit number of the range and the component number in the nineteenth version is encoded;

when the range includes 2 to 128 kinds of number, the difference is encoded with bit data and set to the bit field; and when the range includes 129 to less than $2^{16}$ kinds of number, the difference is encoded with octet data and set to the octet field.

In the present invention, encoding data of values corresponding to the individual types of ASN.1 abstract syntax definition are separated into components as bit data and components as octet data, which are separately packed in the order of the abstract syntax definition into bit field and octet field in the encoding data structure, and padding is made on the bit field to set an octet boundary for subsequent octet field. This eliminates the problems with the prior art Packed Encoding Rules (PER) for ASN.1, increase in processing time due to frequent shift operation and logical AND operation (problem (i)) and increase in encoding data length due to padding on bit data of the individual types (problem (ii)). There is almost no effect of separating and setting bit data and octet data on the encoding and decoding time.

In this case, length information of the bit field is required to distinguish the bit field from the octet field, and there are cases in which the length of the bit field can be beforehand determined from the abstract syntax of ASN.1 and otherwise. For the latter case, offset field is added to set the length of bit field. This eliminates the redundancy to always add the offset field.

It is necessary to determine whether or not the offset field is to be added, however, since this determination can be made from the abstract syntax definition of ASN.1, the determination does not affect on the encoding and decoding time. Further, calculation of the length of bit field has almost no effect on the encoding and decoding time. The abstract syntax definition of ASN.1 is already known between the transmitter and the receiver.

In the present invention, as to the Integer type, the redundancy due to the length information of always more than 1 octet (problem (iii)) can be eliminated, which was a problem with the prior art Packed Encoding Rules (PER) for ASN.1 that a value which can be expressed by 6 bits is included with 2 bits for the length information and encoded as 1 octet.

Further, in the present invention, the only single transfer syntax is defined, the advantage of Aligned transfer syntax in PER and that of Unaligned transfer syntax are maintained, an increase in encoding data length due to padding, which is a disadvantage of Aligned transfer syntax, is eliminated, and frequent bit calculation due to unaligned octet boundary, which is a disadvantage of Unaligned transfer syntax, is eliminated, whereby the need for bit calculation such as shift and logical AND is eliminated to reduce the increase in the encoding data length, and selection of plural transfer syntaxes (Aligned and Unaligned) for individual communication partner (problem (iv)) is not necessary, which was a problem with the prior art Packed Encoding Rules (PER) in the application.

Further, in the present invention, the length information of the bit field set in the offset field is set to a minimum number of bits or octets, thereby preventing the encoding data length from being increased.

Still further, in the present invention, when a constraint is added to the value of Integer type, or the range of component data size (octet length) of Octet type, or the range of component data size (bit length) of BitString type, or the component number (number of repetition components) of Sequence-Of type and Set-Of type by the definition of a sub-type, encoding is made by packing even more efficiently utilizing these constraint. In addition, OctetString type can include various CharacterString types. Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 9 is an example of abstract syntax definition as an embodiment of packed encoding rules (EPER);

FIG. 10 is a setting example of the value to each type of abstract syntax definition of FIG. 9;

FIG. 11 shows encoding data as a transfer syntax corresponding to FIG. 9 and FIG. 10;

FIG. 12 shows data of offset field and bit field in FIG. 11;

FIG. 13 is an example of abstract syntax definition used in the evaluation test;

FIG. 14 is an example of abstract syntax definition used in the evaluation test;

FIG. 15 is an example of abstract syntax definition;

FIG. 16 is a setting example of value to each type of FIG. 15;

FIG. 16 shows encoding data by a prior art PER corresponding to FIG. 15 and FIG. 16;

FIG. 28 shows an example of encoding method when a constraint by a sub-type constrains the size of BitString type to a fixed size (R=1) of 9 or more and not an integer multiple of 8;

FIG. 27 shows an example of encoding method when a constraint by a sub-type constrains the size of BitString type to a fixed size (R=1) of 1 to 7;

FIG. 28 shows an example of encoding method when a constraint by a sub-type constrains the size of BitString type to a range where the kinds R that can be taken between the lower limit size and the upper limit size is $2 \leq R \leq 128$;

FIG. 29 shows an example of abstract syntax used in the evaluation test of packed encoding method utilizing a constraint by a sub-type.

DESCRIPTION OF THE PREFERRED EMBODIMENTS

Figure 1:
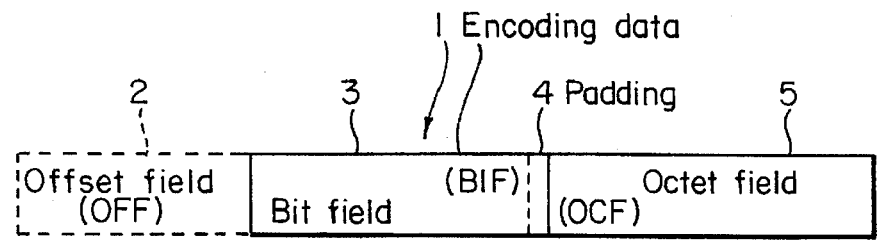
FIG. 1 shows the structure of encoding data according to the present invention.
Figure 7:
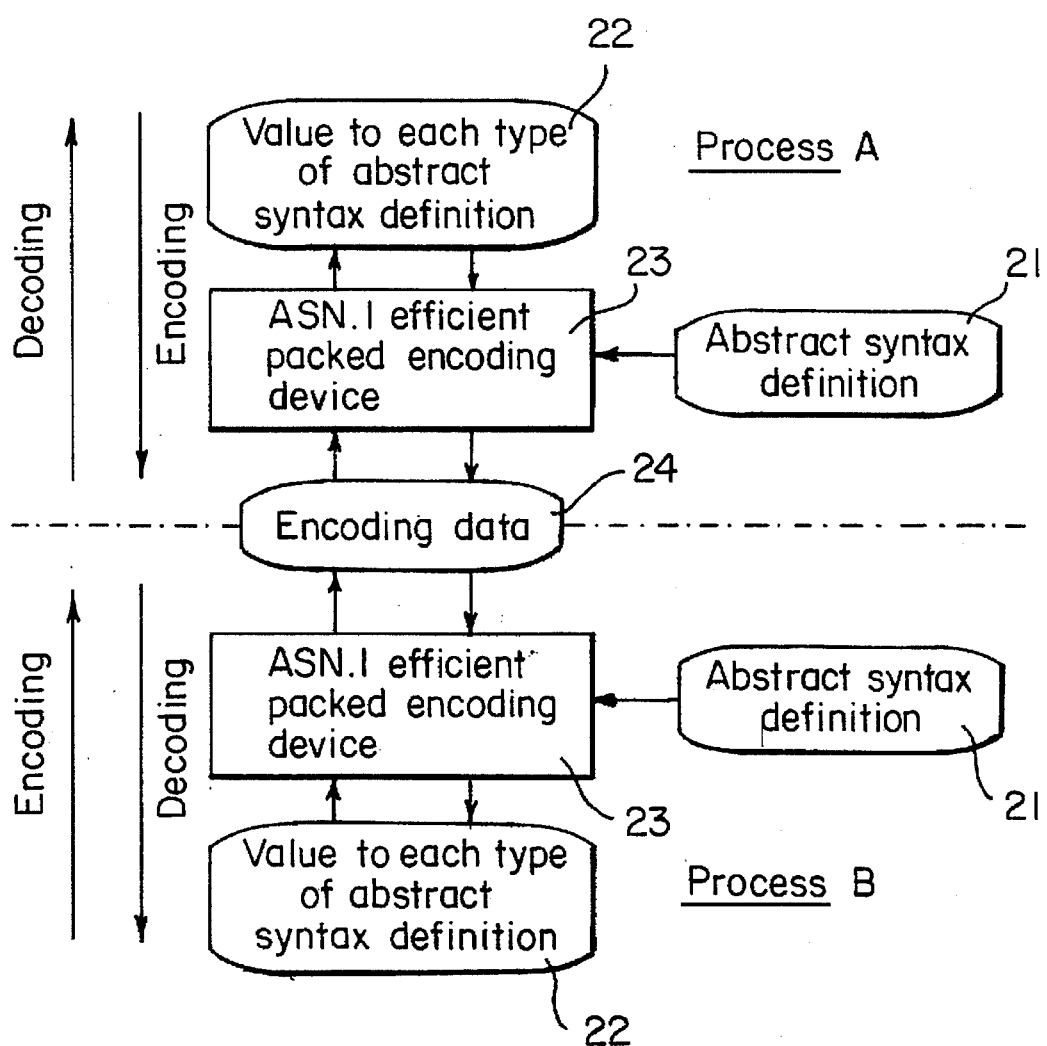
FIG. 7 is a block diagram showing the construction of an efficient packed encoding device.
Figure 8:
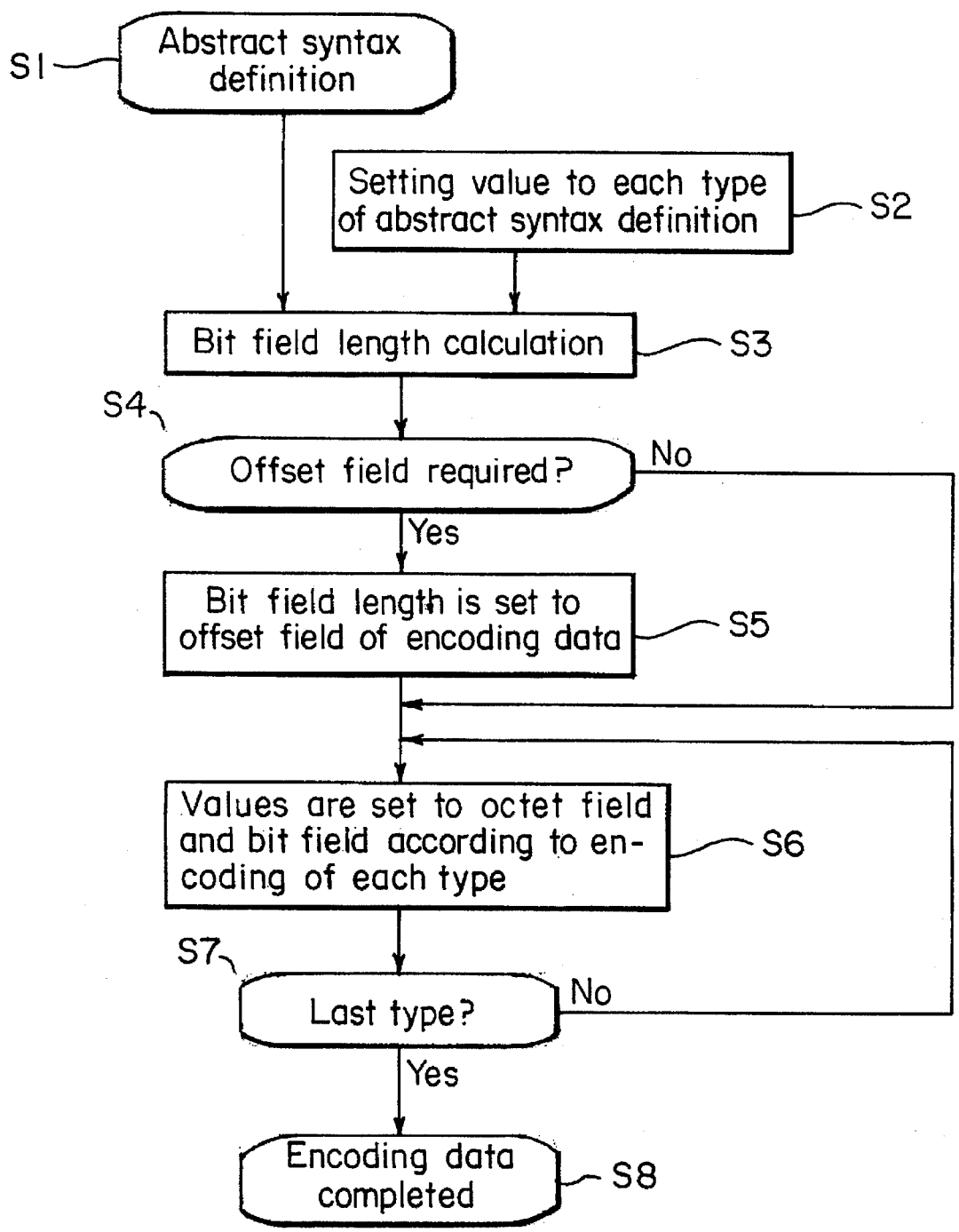
FIG. 8 is a flow chart showing an efficient packed encoding procedure.
Figure 18:
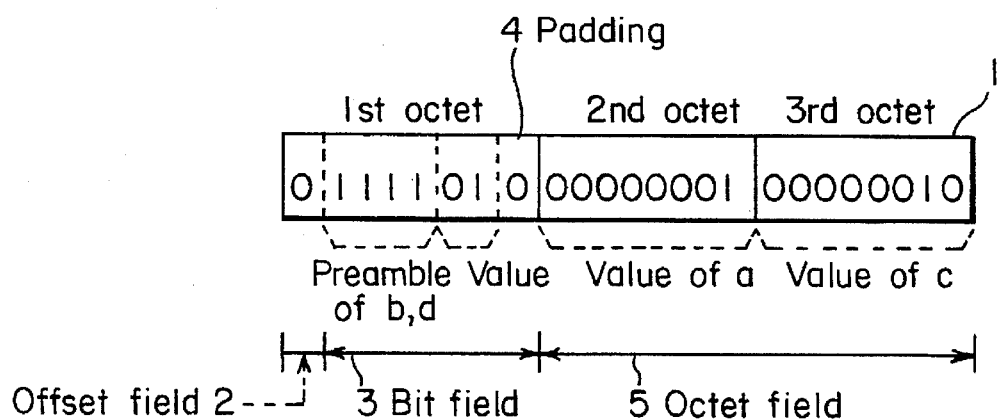
FIG. 18 shows encoding data corresponding to FIG. 15 and FIG. 16 according to the present invention.

The present invention will now be described in detail with reference to the embodiments and drawings. In the drawings, FIG. 1 shows the structure of the encoding data, FIG. 2 to FIG. 6 show details of encoding, FIG. 7 shows the block structure of an efficient packed encoding device, and FIG. 8 shows an encoding procedure. Further, FIG. 9 shows an example of abstract syntax definition using ASN.1 to be encoded, FIG. 10 shows setting examples of value for the individual types of the abstract syntax definition, FIG. 11 shows an encoding example as an abstract syntax, and FIG. 12 shows a data example of offset field and bit field. Further, FIG. 13 and FIG. 14 show examples of abstract syntax definition used in the evaluation experiment, and FIG. 18 shows the encoding data corresponding to FIG. 15 and 18. Further, FIGS. 19 to 29 show individual examples of encoding method utilizing a constraint defined by a sub-type.

As shown in FIG. 1, the structure of an encoding data 1 for ASN.1 comprises three fields, an offset field (hereinafter conveniently abbreviated to as OFF) 2, a bit field (hereinafter conveniently abbreviated to as BIF) 3, and an octet field (hereinafter conveniently abbreviated to as OCF) 5. In the bit field 3, bit data is set among values of individual types of abstract syntax definition to be encoded. In the octet field 5, octet data is set among values of the individual types. In the offset field 2, a length information of the bit field 3 is set in a unit of 8 bits, but is added before the bit field 3 as part thereof only when the length of the bit field 3 is not beforehand determined from the abstract syntax definition of ASN.1. At the rear end of the bit field 3, a padding 4 is added so that a total length of the offset field 2 and the bit field 3 is an integer multiple of 8 bits.

First, adding condition of offset field 2 will be described. In one of the following cases (1) to (4), since the length of the bit field 3 varies in dependence on a value set in the abstract syntax definition, the offset field 2 is necessarily added.

(1) Type of the value is BitString type.

(2) Type of the value is Sequence type or Set type, and includes an optional bit data.

(3) Type of the value is Choice type, and a bit data is included in the choices.

(4) Type of the value is Sequence-Of type or Set-Of type, and the type of repetition component is bit data.

When the offset field is added, the length information of bit field is set, for example, as follows.

(1) When the total bit number of bit data is 1 to 7 bits, bit is allocated to the offset field to set a specific bit data "0"B showing 1 octet as the length of bit field.

(2) When the total bit number of bit data is 0 bit, and 1 to 63 octets, 1 octet is allocated to the offset field to set a specific bit data "10"B to the first and second bit (2 bits) as the length of bit field, and the octet number of bit field is set to the remaining 6 bits.

(3) When the total bit number of bit data is 64 octets or more, 2 octets or more are allocated to the offset field to set a specific bit data "11"B to the first and second bit (2 bits) of the first octet, the octet number of the offset field is set to the remaining 6 bits, and the octet number of bit field is set after the second octet.

Then, use of the bit field 3 will be described. In the following cases (1) to (5), since the type of the value is bit data, the bit field 3 is used, and bit data of each type is packed and encoded in the order of abstract syntax definition. However, when the total bit length of the bit field 3 including the offset field 2 is not an octet boundary, the padding 4 is made with "0"B to align the octet boundary.

(1) Type of the value is Boolean type.

(2) Type of the value is Enumerated type, and the value is within a range from 2 to 128.

(3) Extra bit when type of the value is BitString type, and the length of the value is not an integer multiple of 8 bits.

(4) Preamble when the type of the value is Sequence type or Set type and shows use of optional and default component.

(5) Type of the value is Choice type, is an index showing a selected component, and the value is within a range from 2 to 128.

Then, use of the octet field 5 will be described. Other than the above cases (1) to (5) using the bit field 3, the octet field 5 is used, and each octet data is packed and encoded in the order of the abstract syntax definition.

For example, the octet field is used in Enumerated type when the value is 129 or more, Integer type, Real type, OctetString type, CharacterString type, and BitString type in which the length of value is multiple of 8 bits, part other than extra bit in BitString type when the length of the value is not an integer multiple of 8 bits, index in ObjectIdentifier type, Any type, and Choice type when the index value is 129 or more, and in the number part showing the number of components in Sequence-Of type and Set-Of type.

Then, encoding of the value in Integer type will be describes in detail with reference to FIGS. 2 to 6. Encoding data of Integer type comprises a length indication section and a value data section, and encoding is carried out as in (i) to (v) below depending on the range of the value to be encoded.

Figure 2:
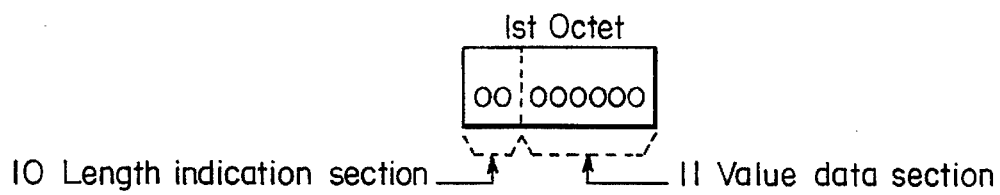
FIG. 2 shows detailed encoding rules according to the range of value of Integer type of the present invention.

(i) For $-2^5 \leq value \leq 2^5-1$:

In this case, as shown in FIG. 2, encoding is made in 1 octet including a length indication section 10 and a value data section 11. A total of 2 bits of the eighth and seventh bits in the octet is allocated to the length indication section 10, where a fixed value indicating the use of 1 octet as the length, for example, "00"B is set. B indicates binary notation. A remaining total of 6 bits from the sixth to first bit in the octet is the value data section 11, where the value is set in binary notation. In the example of FIG. 2, the value is 0.

Figure 3:
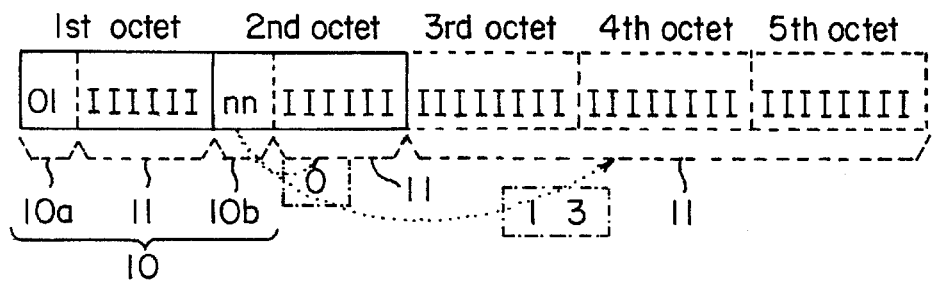
FIG. 3 shows detailed encoding rules according to the range of value of Integer type of the present invention.

(ii) For $-2^{35} \leq value \leq -(2^5+1)$ and $2^5 \leq value \leq 2^{35}-1$:

In these cases, as shown in FIG. 3, encoding is made within a range from 2 to 5 octets including the length indication section 10 and the value data section 11. The length indication section 10 is assigned for the individual eighth and seventh bits 10a and 10b of the first octet and second octet. As the length, a fixed value "01"B showing use of 2–5 octets is set to the part 10a of 2 bits of the eighth and seventh bits of the first octet, and a variable value "nn"B corresponding to the number of data octets 0–3 following the third octet and after is set to the 2-bit part 10b of the eighth and seventh bits of the second octet. On the other hand, the remaining 6 bits of the first octet, the remaining 6 bits of the second octet, and subsequent data octets are the value data section 11, where the value is set in binary notation.

Figure 4:
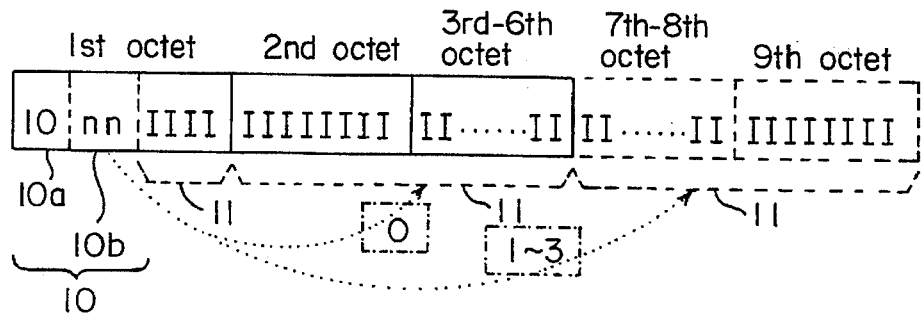
FIG. 4 shows detailed encoding rules according to the range of value of Integer type of the present invention.

(iii) For $-2^{67} \leq \text{value} \leq -(2^{35}+1)$ and $2^{35} \leq \text{value } 2^{67}-1$:

In these cases, as shown in FIG. 4, encoding is made within a range from 6 to 9 octets including the length indication section 10 and the value data section 11. The length indication section 10 is assigned for the parts 10a and 10b of 2 bits from the eighth to fifth bit of the octet. As the length of the value, a fixed value "10"B showing use of 6–9 octet is set to the 2-bit part 10a of the eighth and seventh bits, and a variable value "00"B to "11"B corresponding to following data octet number 0–3 after the sixth octet is set to the 2-bit part 10b of the sixth and fifth bits. On the other hand, the remaining 4 bits of the first octet and subsequent data octets after the second octet are the value data section 11, where the value is set in binary notation.

Figure 5:
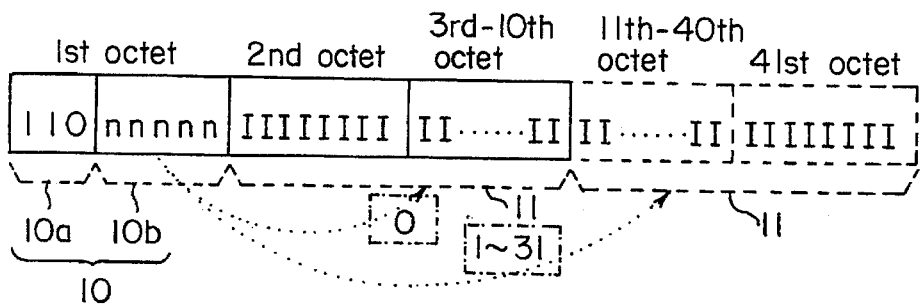
FIG. 5 shows detailed encoding rules according to the range of value of Integer type of the present invention.

(iv) For $-2^{(40 \times 8+4)} \leq \text{value} \leq -(2^{67}+1)$ and $2^{67} \leq \text{value} \leq 2^{(40 \times 8+4)} - 1$:

In these cases, as shown in FIG. 5, encoding is made within a range from 9 to 41 octets including the length indication section 10 and the value data section 11. The length indication section 10 is assigned for the entire first octet, and comprises two parts 10a and 10b. As the length of the value, a fixed value "110"B showing use of 9 to 41 octets is set to the 3-bit part 10a of the eighth-sixth bits of the first octet, and a variable value "00000"B to "11111"B corresponding to the subsequent data octet number 0–31 after the tenth octet is set to the remaining 5 bits of the first octet. On the other hand, the data octet after the second octet is the value data section 11, where the value is set. in binary notation.

Figure 6:
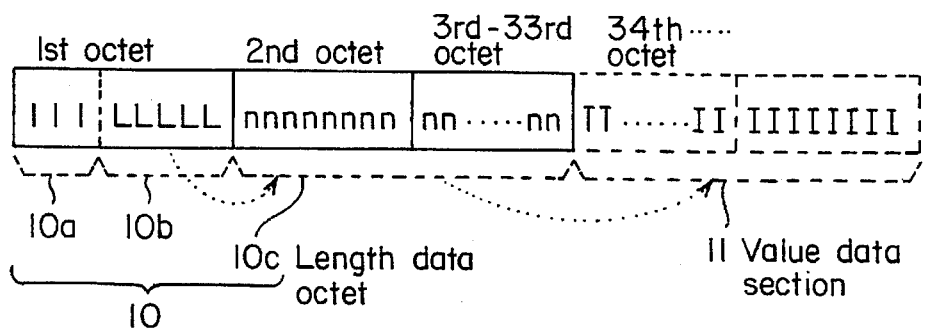
FIG. 6 shows detailed encoding rules according to the range of value of Integer type of the present invention.

(v) For value $\leq -(2^{(40 \times 8+4)}+1)$ and $2^{(40 \times 8+4)} \leq \text{value}$:

In these case. as shown in FIG. 6, encoding is made in 42 octets or more including the length indication section 10 and the value data section 11. The length indication section 10 is assigned for two or more octets, and comprise three parts. As the length of the value, a fixed value "111"B showing use of 42 bits or more is set to the 3-bit part 10a of the eighth-sixth bit in the first octet of the length indication section 10, and a variable value "00000"B to "11111"B corresponding to the octet number 1 to 32 of the length data octet part 10c after the second octet is set to the remaining part 10b of 5 bits of the first octet. A variable value "n ... n"B showing the data octet number of the value data section 11 following the length indication section 10 is set to the length data octet part 10c after the second octet. The value itself is set in binary notation in the value data section.

Then, encoding rules for each type of ASN.1 will be described.

Boolean type: Value of this type includes True (0) and False (1), and encoded in 1 bit to BIF (bit field).

Enumerated type: In this type, depending on the number N of the enumerated value, encoding is not made for N=1, the order is set to BIF for $2 \leq N \leq 128$, and the order is set to OCF (octet field) for $129 \leq N$.

Null type: In this type, basically encoding is not made. However, for optional or default in components such as of Set type, bit data indicating the presence of such components is set to the preamble of BIF.

Integer type: In this type, depending on the range of the value as described above, encoding is made to OCF in 1 octet for $-32 \leq \text{value} \leq 31$, in 2–5 octets for $-2^{35} \leq \text{value} \leq 2^{35}-1$, and in 6 or more octets for other cases.

Real type: In this type, the length information is encoded by the same rules as LI in PER (prior art Packed Encoding Rules), the value is encoded by the same encoding rules as BER (Basic Encoding Rules), and the length and the value are set to OCF.

OctetString type: In this type, the length information is encoded by the same rules as LI in PER, and the length information and the value are set to OCF.

CharacterString type: In this type, the length information is encoded by the same rules as LI in PER, and the length information and the value are set to OCF.

BitString type: In this type, the length information indicating the bit length of the value is encoded by the same rules as LI in PER and set to OCF (octet field), extra bit which is not an integer multiple of 8 bits of the value is set to BIF, and others are set to OCF.

ObjectIdentifier type: In this type, the length information is encoded by the same rules as LI in PER, the value is encoded by the same encoding rules as BER, and the length information and the value are both set to OCF.

Any type: In this type, the length information is encoded by the same rules as LI in PER, the value is encoded in the encoding data structure of FIG. 1 corresponding to the data type separately defined by ASN.1, and the length information and the value are set to OCF.

Sequence type and Set type: In these types, of the preamble and one or more components, for the preamble, a value of component present (1)/absent (0) is set to BIF by a set of bit data showing the presence of optional or default component. When the optional or default component is not used in these types, the preamble is not encoded. The components are encoded according to the encoding rules, which are described above or will be described, for the type of the individual components. However, for encoding Set type, in addition to the above, the individual components are encoded in the canonical order.

Choice type: In this type, the index shows selected components, for the value of the index, using a value of 0 or more which components allocated in the canonical order, encoding is not made when the number of components is one, for 2 to 128, encoding is made to BIF in a bit number necessary for expressing the number of components—1, and for 129 or more, encoding is made to OCF by the same rules as LI (length of the value of OctetString type or the like) in PER. The selected component is encoded according to the encoding rules, which are described above or will be later.

Sequence-Of and Set-Of types: In these types, the number part showing the number of components of 0 or more is encoded to OCF by the same rules as LI in PER. The type of component, as a component part, is encoded according to the above-described encoding rules for the type.

Then, the encoding procedure will be described with reference to FIG. 7 and FIG. 8. Suppose a case where values of the individual types of abstract syntax definition described using ASN.1 are encoded, and transmitted and received between two processes A and B as shown in FIG. 7. Each of the processes A and B is provided with a memory device 21 for storing the abstract syntax definition to be encoded, a memory device for storing a value of each type of the abstract syntax definition, and an efficient packed encoding device 23. In brief, when transmission is made from the process A to the process B, the efficient packed encoding device 23 of the process A prepares encoding data 24 from a specific abstract syntax definition stored in the memory device 21 and a value of each type of the specific abstract syntax definition stored in the memory device, and transmits the encoding data 24 to the communication line. The efficient packed encoding device 23 of the process B makes decoding from the received encoding data 24 and the same specific abstract syntax definition as the process A side stored in the memory device 21 to prepare a value to each type, which is stored in the memory device 22. Similar procedure is used for transmission from the process B to the process A.

Detailed operation of the efficient packed encoding device 23 will be described.

First in step S1, an abstract syntax definition described in ASN.1 to be encoded is selected and, in step S2, a value corresponding to each type of the abstract syntax definition is set.

Then, in step S3, a total number of bits of bit data to be set in the bit field is calculated from the abstract syntax definition and its value of each type to calculate the length of the bit field.

Then, in step S4, a determination is made as to whether or not the abstract syntax definition to be encoded corresponds to any of the above-described offset field addition conditions (1) to (4). In this determination, when addition of offset field is required, in step S5, the length of the bit field calculated in the previous step S3 is set to an offset field 2 of the encoding data 1 shown in FIG. 1. Further, when addition of offset field is not required, nothing is made and the processing proceeds to step S6.

In step S6, type is pursued according to the abstract syntax definition, encoding is made to each type according to the abstract syntax definition, and packed in the order of the definition to separately set the bit data to the bit field 3 of FIG. 1 and the octet data to the octet field 5, thus preparing the encoding data 1. The procedure of step S6 is applied to the individual types until the last type is reached (step S7).

The encoding data is completed by the above steps S1 to S7 (step S8).

For decoding, the reverse processing of FIG. 8 is applied.

<Practical example of efficient packed encoding>

Next, a practical example of efficient packed encoding rules (EPER) applied will be described with reference to FIGS. 9 to 12. Here, abstract syntax definition of "Employees" shown in FIG. 9 is encoded.

In the abstract syntax definition by ASN.1 shown in FIG. 9, it is understood that Employees are Sequence-Of type comprising at least 0 component of PersonalRecord, and each PersonalRecord type is Sequence type comprising individual components of number, sex, age, firstName, lastName, single, and optional children. Further, of the individual components, the number is an integer value, the sex is a value of male (0) or female (1) of Enumerated type, the age is an integer value, the firstName is a value of PrintableString type which is a kind of CharacterString type, the lastName is also a value of PrintableString type, and the single is a value of TRUE or FALSE of Boolean type. Further, the Children Information type is Sequence-Of type of at least 0 component of Sequence type comprising firstName and age, and the firstName is a value of PrintableString type, and the age is a value of Integer type.

FIG. 10 shows an example of the values set to the abstract syntax definition "Employees". In this example, two PersonalRecord types are set.

(1) As values of the first PersonalRecord type, the number is 1, the sex is male (0), the age is 35, the firstName is Taro, the lastName is Yamada, the single is FALSE, and the Children Information of i are set, and as values of Children Information, the firstName is Jiro, and the age is 3.

(2) As values of the second PersonalRecord type, the number is 2, the sex is female (1), the age is 25, the firstName is Hana, the lastName is Sato, and the single is TRUE.

FIG. 11 shows the encoding data 1 in hexadecimal notation, prepared from the abstract syntax definition (Employees) in FIG. 9 and the values of individual types of FIG. 10. FIG. 12 shows details of the offset field 2 and the bit field 3 in binary notation.

(a) First, the total bit number of the bit data is calculated. It is 6 bits. This is because since 1 bit is allocated to the preamble indicating the presence or absence of optional Children for one PersonalRecord, it is a total of 6 bits when two PresonalRecords are used.

(b) Then, a determination is made as to the offset field addition condition. The offset field is required. This is because Employees is Sequence-Of type, and the repetition components sex and single of PersonalRecord type are bit data, which satisfy the offset field addition condition.

(c) When the offset field is to be added, the length information of the bit field is set to the offset field 2. The length information indicates the total length of the offset field and the bit field in a unit ef octet, when the total bit number of the bit data is 6 bits, 1 bit is allocated to the offset field, and a fixed value of "0"B is set.

That is, when the total bit number of the bit data is 1 to 7 bits, since a total length of the offset field and the bit field of 1 octet is sufficient, 1 bit is allocated to the offset field, where "0"B corresponding to 1 octet is set. When the total bit number of the bit data is 0 bit, and 1 to 63 octets, 1 octet is allocated to the offset field, where a fixed value "10" is set to the top two bits, and the octet number is set by the remaining 6 bits. Further, when the total bit number of the bit data is 64 octets or more, 2 octets or more are allocated to the offset field, "11"B is set to the first and second bit (2 bits) of the first octet, the octet number after the second octet is set to the remaining 6 bits, and the octet number of the bit field is set after the second octet.

(d) Then, the bit data is set to the bit field 3 in the order of the abstract syntax definition as shown in FIG. 12, and padding 4 is made only on "0"B and 1 bit.

(e) Further, octet data of each type is set to the octet field 5 in the order of the abstract syntax definition as shown in FIG. 11. In the encoding data in FIG. 11, "02"H of the second octect is a Number part of the number of Sequence-OF indicating the presence of two PersonalRecords, and "01"H of the 17th octet is a number part of Sequence-Of indicating the presence of one ChildrenInformation.

<Evaluation experiments>

Next, as an evaluation test, the efficient packed encoding rules (EPER) of the present invention, PER (prior art packed encoding rules), and BER (basic encoding rules) are individually applied to encoding of the abstract syntax definition "Example 1" shown in FIG. 13, the abstract syntax definition "Example 2" shown in FIG. 14, and an abstract syntax definition of m-Get operation result of CMIP (ISO/IBC 9596:1991, Common Management Information Protocol) in OSI System Management as an example of practical application layer protocol (not shown). As evaluation test results, encoding/decoding time (msec) is shown in Table 1, and encoding data length (number of octets) is shown in Table 2. In this evaluation test, NEWS 3860 is used as the computer.

Example 1 of FIG. 13 and Example 2 of FIG. 14 are abstract syntax definitions which clearly show the problems of PER and, in each of the cases, there are 20 Sequence-Of elements. The m-Get operation shows a search result of 50 attribute values.

TABLE 1

Encoding/decoding time (msec)

|  | Example 1 | | Example 2 | | m-Get operation | |
|---|---|---|---|---|---|---|
|  | En-coding | De-coding | En-coding | De-coding | En-coding | De-coding |
| Present invention | 0.045 | 0.035 | 0.106 | 0.039 | 0.310 | 0.170 |
| PER (Aligned) | 0.078 | 0.060 | 0.129 | 0.054 | 0.430 | 0.330 |
| PER (Unaligned) | 0.084 | 0.062 | 0.318 | 0.223 | 0.670 | 0.560 |
| BER | 0.340 | 0.380 | 0.345 | 0.436 | 0.924 | 1.356 |

TABLE 2

Encoding data length (octet)

|  | Example 1 | Example 2 | m-Get operation |
|---|---|---|---|
| Present invention | 25 | 385 | 509 |
| PER (Aligned) | 61 | 401 | 602 |
| PER (Unaligned) | 44 | 384 | 558 |
| BER | 163 | 504 | 758 |

According to the experiments, the encoding time of the efficient packed encoding rules (EPER) of the present invention is 1.2 to 1.7 times and 1.9 to 3.0 times higher in speed than PER Aligned transfer syntax and PER Unaligned transfer syntax, respectively. Further, the decoding time of the efficient packed encoding rules (EPER) of the present invention is 1.4 to 1.7 times and 1.7 to 5.7 times higher in speed than PER Aligned transfer syntax and PER Unaligned transfer syntax, respectively. Further, the encoding data length by the efficient packed encoding rules (EPER) of the present invention is less than a half that of PER Aligned transfer syntax for Example 1.

On the other hand, according to the experiments, the encoding time of the efficient packed encoding rules (EPER) of the present invention is 3.0 to 7.6 times higher in speed than BER, then decoding time of the efficient packed encoding rules (EPER) of the present invention is 3.3 to 11.0 times higher in speed than BER, and the encoding data length of the efficient packed encoding rules (EPER) of the present invention is reduced to 15 to 77% of BER, with a substantial improvement of performance.

Figure 17:
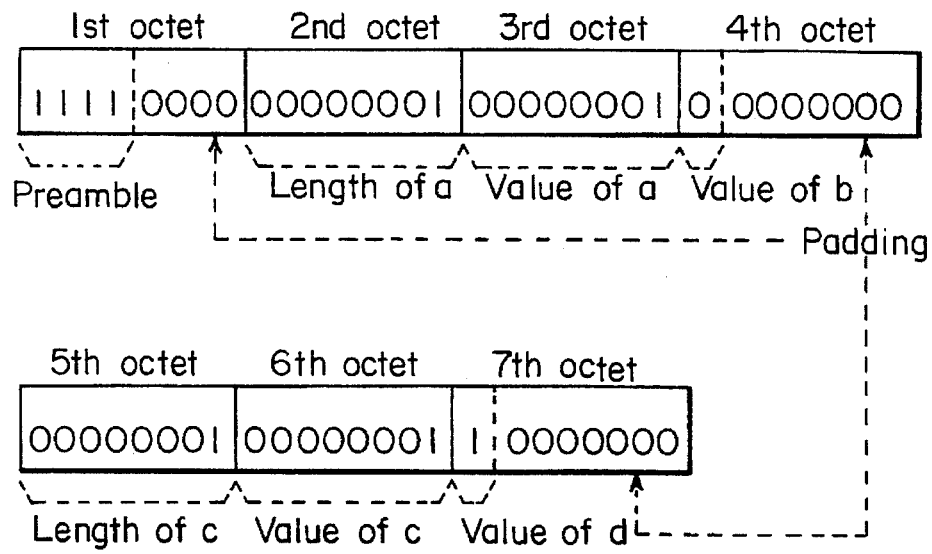

For comparison with PER, encoding data when the present invention is applied to the abstract syntax definition "A" in FIG. 15 and value setting examples of individual types of FIG. 16 are shown in FIG. 18. The total encoding data length is 3 octets, considerably reduced from FIG. 17.

Then, examples of efficient packed encoding method for ASN.1 utilizing a constraint defined by a sub-type will be described with reference to FIGS. 19 to 29.

First, constraint by a sub-type will be described. In Integer type, OctetString type (including CharacterString type), BitString type, Sequence-Of type, and Set-Of type in ASN.1, constraint on the range of value which can be taken by the type utilizing the sub-type, the range of octet length (size), the range of bit length (size), and the range of number (size) of repetition components can be described on the abstract syntax.

For example, a constraint of "INTEGER (0..128)" shows that the range of Integer type is 0 (lower limit) to 128 (upper limit). Further, "OCTET STRING (16)" shows that the component data size (length of octet string) of OctetString type is a fixed size of 16 octets. "SEQUENCE SIZE (20) OF" shows that the component size (number of repetition components) of Sequence-Of type is a fixed number of 20.

For individual types, efficient packed encoding method utilizing a constraint by sub-type will be described in detail. In the description, X and Y indicate finite values of X<Y which are different from each other, MAX indicates a positive infinite, and MIN indicates a negative infinite. Further, R=upper limit −lower limit +1, and R indicates a number of values, size or number of types which can be taken in a range (size range) defined by the lower limit and the upper limit.

<Integer type>

In Integer type, encoding of the value is divided into the following (1) to (4) according to the method of giving a constraint.

Figures 19, 20:
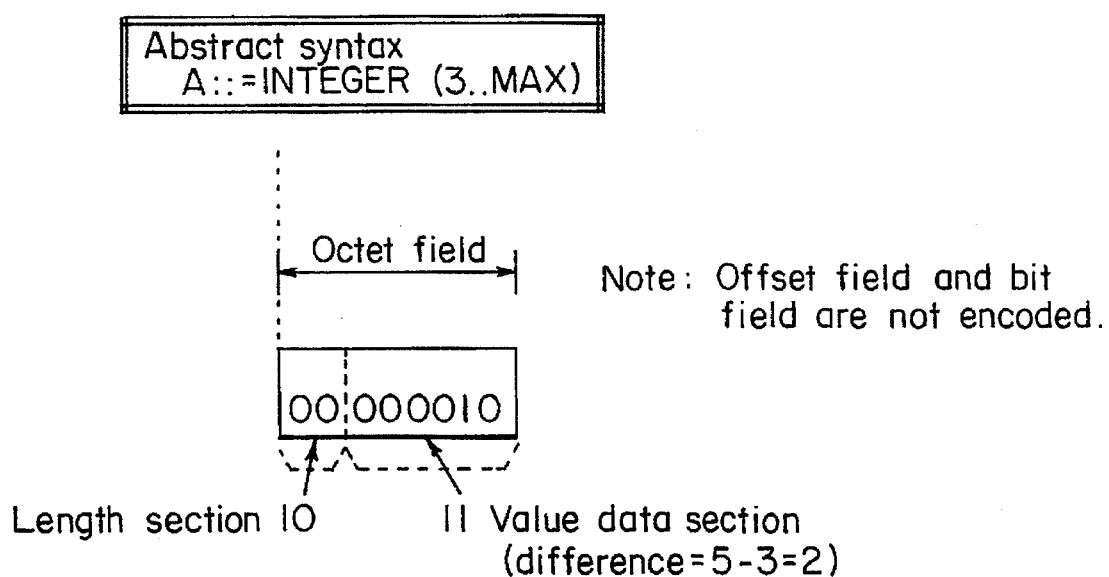
FIG. 19 shows an example of packed encoding method when a constraint by a sub-type constrains only the lower limit of value of Integer type.
FIG. 20 shows an example of packed encoding method when a constraint by a sub-type constrains the value of Integer type to a range where the kinds R that can be taken between the lower limit value and the upper limit value is R=1.

(1) When constraint of a single value is given as a constraint, Integer type is not encoded. This is because the value of Integer type is obvious from the description of abstract syntax in ASN.1, and encoding only increases the redundancy. Constraint to a single value is described by the lower limit and the upper limit which are equal to each other such that "INTEGER (X ... X)". The latter means R=1, and an example is shown in FIG. 20.

(2) When constraint is given to the lower limit (lower value) X or the upper limit (upper value) such that "INTEGER (X ... MAX)" or "INTEGER (MIN ... Y)": value range of "semi constrained whole number":

In this case, to convert the value to be encoded to a value as small as possible to shorten the data length, an offset value from a component data value based on the lower limit or upper limit of constraint, that is, a difference, is encoded according to the encoding method of Integer type in which constraint is not used as already described with reference to FIGS. 2 to 6. A negative value may be used for the difference, however, packing effect can be enhanced by using Positive-binary-integer encoding. An optimum encoding example will be shown by sizes of the difference.

(2-1) $0 \leq \text{difference} \leq 63$: In this case, since the difference can be represented in 6 bits, as shown in FIG. 19, encoding is made with 1 octet including a length section 10 and a value data section 11. The eighth bit and the seventh bit in the octet are allocated as the length section 10, where a fixed value showing the use of 1 octet, for example, "00"B is set as length information. B indicates binary notation. The remaining 6 bits from the sixth bit to the first bit in the octet are the value data section 11, where the difference set in binary notation. The encoding data (1 octet) is set to the octet field. The offset field and the bit. field are not used. In the example shown in FIG. 19, the value is 5, the lower limit is 3, and therefore the difference is 2.

(2-2) $64 \leq \text{difference} \leq 2^{36}-1$: In this case, encoding is made with 2 to 5 octets including the difference and its length information, and the result is set to the octet field. That is, similar to FIG. 3, encoding is made with 2 to 5 octets including the length section 10 and the value data section 11. To the length section 10, the individual eighth and seventh bits 10a and 10b of the first octet and second octet are allocated. As length information, a fixed value "01"B showing the use of 2 to 5 octets is set to 2 bits of the eighth and seventh bits of the first octet, and a variable value "nn"B corresponding to the number 0 to 3 of the data octet following the third octet is set to 2 bits 10b of the eighth and seventh bits of the second octet. On the other hand, the remaining 6 bits of the first octet, remaining 6 bits of the second octet, and following data octet are the value data section 11, where the difference is set in binary notation.

(2-3) $2^{36} \leq$ difference $\leq 2^{68}-1$: In this case, similar to the example shown in FIG. 4, the difference is encoded with 6 to 9 octets including the length section 10 and the value data section 11 and set to the octet field. The length section 10 is allocated with a total of 4 bits 10a and 10b of the eighth to fifth bit of the first octet. As the length information of the difference, a fixed value "10"B showing the use of 6-9 octets is set to the 2 bit section of eighth and seventh bit, and a variable value "00"B to "11"B corresponding to the data octet number after the sixth octet is set to a total of 2 bits of the sixth and fifth bit. On the other hand, the remaining 4 bits of the first octet and data octet after the second octet are the value data section 11, where the difference is set in binary notation.

(2-4) $2^e \leq$ difference $\leq 2^{(40 \times 8+5)}-1$: In this case, similar to the example shown in FIG. 5, the difference is encoded with 9 to 41 octets including the length section 10 and the value data section 11 and set to the octet field. The length section 10 is allocated with all the first octet, and comprises two sections 10a and 10b. As the length information of the difference, a fixed value "110"B showing the use of 9 to 41 octets is set to the 3 bit section of eighth to sixth bit of the first octet, and a variable value "00000"B to "11111"B corresponding to the data octet number 0 to 31 after the tenth octet is set to the remaining 5 bits of the first octet. On the other hand, data octet after the second octet is the value data section 11, where the difference is set in binary notation.

(2-5) $2^{(40 \times 8+5)} \leq$ difference: In this case, similar to the example shown in FIG. 6, the difference is encoded with 42 octets or more including the length section 10 and the value data section 11 and set to the octet field. The length section 10 is allocated with 2 or more octets, and comprises 3 parts. As the length information of the difference, a fixed value "111"B showing the use of 42 octets or more is set to the 3 bit section 10a of eighth to sixth bit in the first octet of the length section 10, and a variable value "00000"B to "11111"B corresponding to the octet number 1 to 32 of the length data octet section 10c after the second octet is set to the remaining 5 bits of the first octet. The length data octet section 10c after the second octet is set with a variable value "n ... n"B showing the data octet number of the value data section 11 after the length section 10. The difference itself is set to the value data section 11 in binary notation.

(3) When a constraint of finite lower limit and upper limit is given as "INTEGER (X ... Y)" (value range of "Constrained whole number)" and R=Y–X+1 $\leq 2^{16}$ (64K):

In this case, the length information is not encoded, but an offset value from the component data based on the lower limit X or the upper limit Y, that is, the difference, is encoded as follows according to the range of R.

(3-1) R=1: As shown in FIG. 20, encoding is not made when R=1.

Figure 21:
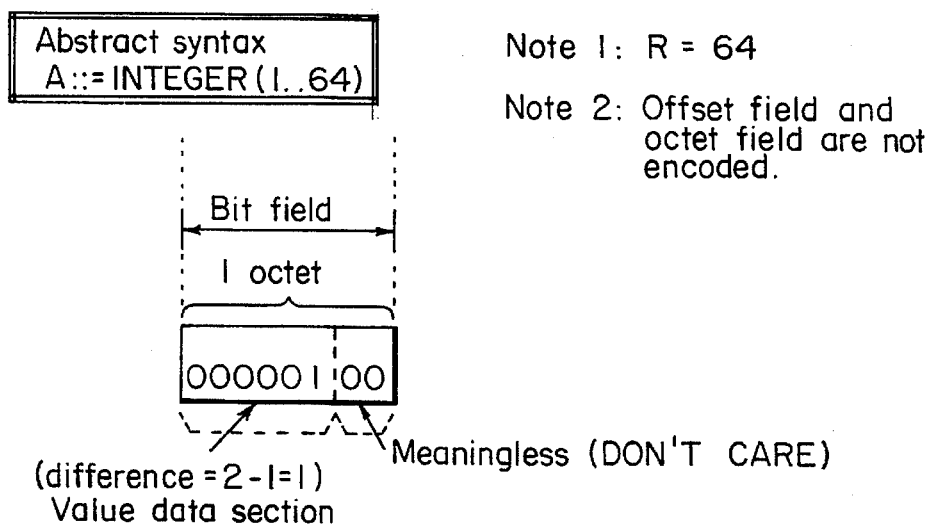
FIG. 21 shows an example of encoding method when a constraint by a sub-type constrains the value of Integer type to a range of $2 \leq R \leq 128$.

(3-2) $2 \leq R \leq 128$: In this case, the difference is encoded with a minimum bit number that can be represented and set to the bit field. The minimum bit number (size) that can be represented is determined as shown in Table 3 depending on the range of R, from a minimum of 1 bit to a maximum of 7 bits. FIG. 21 shows an example of encoding a difference 1 (value is 2, lower limit is 1) when R=64.

Figure 22:
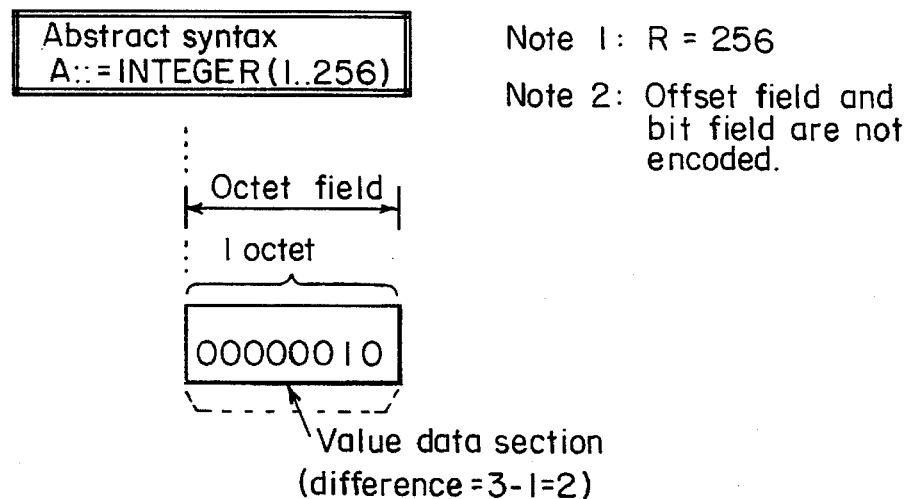
FIG. 22 shows an example of encoding method when a constraint by a sub-type constrains the value of Integer type to a range of $129 \leq R \leq 64K (=2^{16})$.

(3-3) $129 \leq R \leq 64K$: In this case, the difference is encoded with a minimum octet number (size) that can be represented and set to the octet field. The minimum octet number (size) that can be represented is determined as shown in Table 4, from a minimum of 1 octet to a maximum of 2 octets. FIG. 22 shows an example of encoding a difference 2 (value is 3, lower limit is 1) when R=256.

TABLE 3

(set to the bit field)

| R | Size (bit number) |
|---|---|
| 2 | 1 |
| 3, 4 | 2 |
| 5, 6, 7, 8 | 3 |
| 9 to 16 | 4 |
| 17 to 32 | 5 |
| 33 to 64 | 6 |
| 65 to 128 | 7 |

TABLE 4

(set to the octet field)

| R | Size (octet number) |
|---|---|
| 129 to 256 | 1 |
| 257 to 64K | 2 |

(4) When a constraint is given to finite lower limit and upper limit as "INTEGER (X ... Y)", and $2^{16}$ (64K)<R= Y–X+1: In this case, encoding is made as in the above case (2) where only one of the lower limit and upper limit is constrained.

<OctetString type>

In OctetString type, encoding of the component data (octet data string) is divided into the following (5) to (9) depending on the constraint applied.

(5) Since the component data size (unit: in octet) of OctetString type is 0 octet or more, when a constraint of zero size (upper limit size is zero) is applied, encoding is meaningless and is not made.

Figure 23:
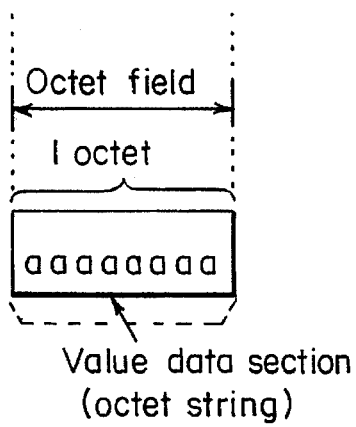
FIG. 23 shows an example of encoding method when a constraint by a sub-type constrains the component data size of OctetString type to a single size.

(6) When a constraint of a single size or fixed size is applied, such as "OCTET STRING (SIZE (X))", or "OCTET STRING (SIZE(X ... X))" where the lower limit size is equal to the upper limit size, since the length information is obvious, it is not encoded, but only the component data value is encoded as octet data string, and set to the octet field. FIG. 23 shows an encoding example when "OCTET STRING (SIZE (1 ... 1))".

(7) When a constraint is applied to both the lower limit size and the upper limit size (constrained whole number) such as "OCTET STRING (SIZE (X ... Y))", and R=Y–X+1 <64K (=$2^{16}$):

In this case, the component data value is encoded with octet data string and set to the octet field. However, as the length information, a difference between the lower limit size X or the upper limit size Y of the range and the component data size itself is encoded as shown below depending on the range of R and set to the bit field or the octet field.

(7-1) R=1 (octet): When R=1, encoding is not made as described above in (6).

Figure 24:
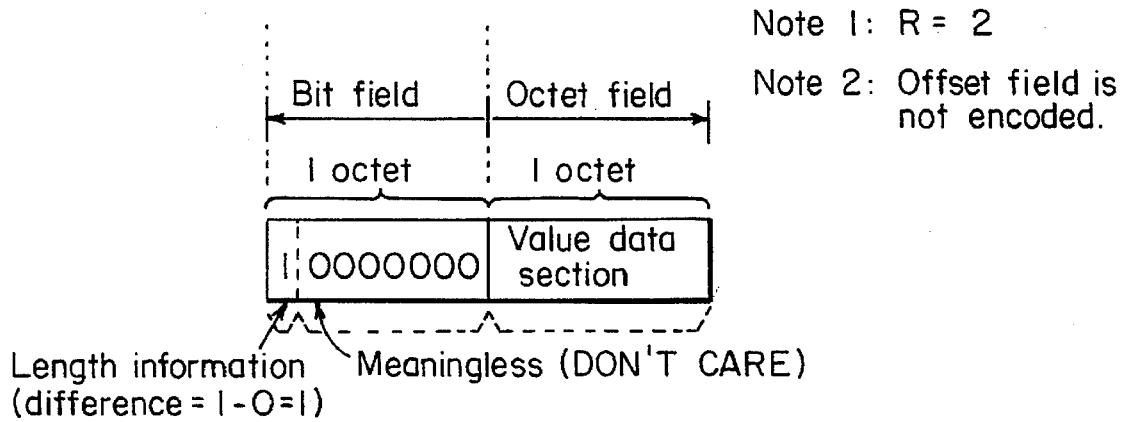
FIG. 24 shows an example of encoding method when a constraint by a sub-type constrains the size of OctetString type to a range where the kinds R of size that can be taken between the lower limit size and the upper limit size is $2 \leq R \leq 128$.

(7-2) $2 \leq R \leq 128$ (octet): In this case, the same procedure is used as in (3-2) of Integer type, the difference of size as the length information is encoded with a minimum bit number that can be represented and set to the bit field. The minimum bit number that can be represented is determined as shown in Table 3 depending on the range of R, from a minimum of 1 bit to a maximum of 7 bits. FIG. 24 shows an encoding example when R=2.

(7-3) $129 \leq R < 64K$ (octet): In this case, as in (3-3) of Integer type described above, the difference of size as the length information is encoded with a minimum octet number that can be represented and set to the octet field. The minimum octet number that can be represented is determined as shown in Table 4 depending on the range of R, from a minimum of 1 octet to a maximum of 2 octets.

(8) When a constraint is applied to both the lower limit size X and the upper limit size such as "OCTET STRING (SIZE (X ... Y))", but R=Y−X+1≧64K octets: In this case, since the constraint to the size range is too broad, the constraint is not used as the length information, but the component data size itself is encoded with octet data string and set to the octet field. The component data value itself is of course encoded with octet data string and set to the octet field.

(9) When a constraint is applied to only the lower limit size X but the upper limit is indefinite such as "OCTET STRING (SIZE (X ... MAX))": In this case, since the constraint to the size range is too broad, the constraint is not used as the length information, but the component data size itself is encoded with octet data string and set to the octet field as in (8) above. The component data value itself is of course encoded with octet data string and set to the octet field.

In OctetString type, MIN means zero, for example, "OCTET STRING (SIZE (MIN ... Y))" is the same as "OCTET STRING (SIZE (0 ... Y))".

<BitString type>

In BitString type, encoding of the component data (bit data string) is divided into the following (10) to (14) depending on the constraint applied.

(10) In BitString type, since the component data size (unit: in bit) is 1 bit or more, when a constraint is applied to zero size (upper limit size is zero), encoding is meaningless and is not made.

(11) When a constraint of a single size or fixed size is applied, such as "BIT STRING (SIZE (X))", or "BIT STRING (SIZE(X ... X))" where the lower limit size is equal to the upper limit size, since the length information is obvious, it is not encoded, but only the component data value is encoded. However, in encoding of the component data, the bit field and the octet field are used according to the data string size as shown below.

Figure 25:
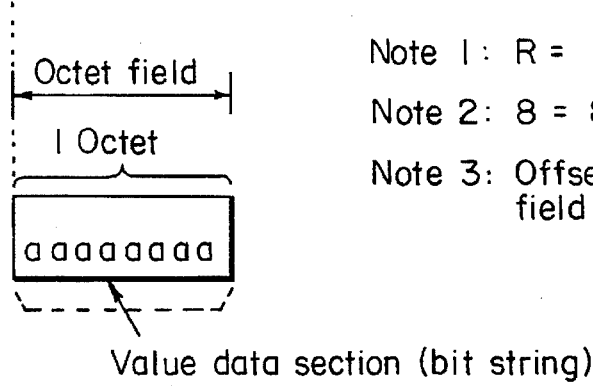
FIG. 25 shows an example of encoding method when a constraint by a sub-type constrains the component data size of BitString type to a fixed size (R=1) of 8 or more and an integer multiple of 8.

(11-1) When the component data size is 8 bits or more and an integer multiple of 8:

In this case, since the bit data string is arranged in units of octet, the component data is all set to the octet field. FIG. 25 shows an encoding example of "BIT STRING (SIZE (8 ... 8))".

Figure 26:
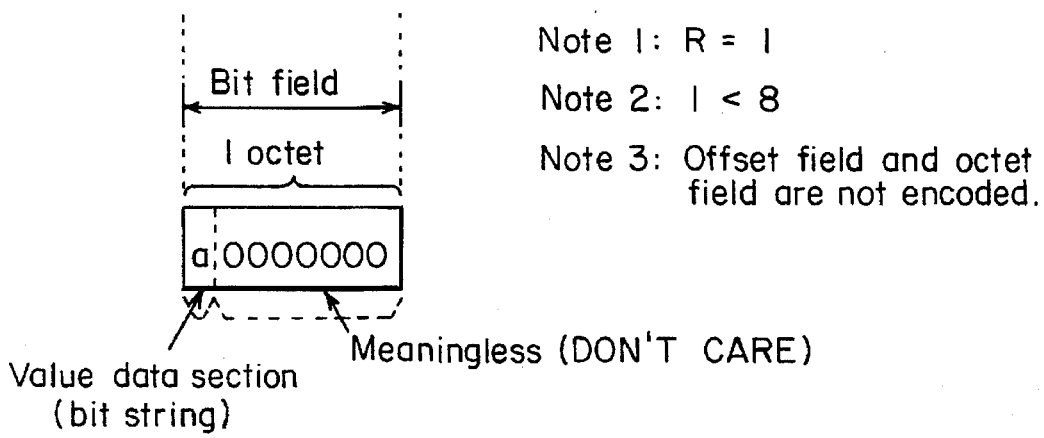

(11-2) When the component data size is less than 8 bits:
In this case, since the component data size is less than octet unit, the component data is all set to the bit field. FIG. 26 shows an encoding example of "BIT STRING (SIZE (1 .. . 1))".

(11-3) When the component data size exceeds 8 bits and is not an integer multiple of 8:

In this case, of the component data, bit string of the part which can be arranged in octet unit is set to the octet field, and bit string of fraction in octet unit is set to the bit field. FIG. 27 shows an encoding example of "BIT STRING (SIZE (9 ... 9))".

(12) When a constraint is applied to both the lower limit size and the upper limit size (constrained whole number) such as "BIT STRING (SIZE (X ... Y))", and R=Y−X+1<64K (=$2^{16}$):

In this case, the component data value (bit data string) is set by selectively using the bit field and the octet field according to the size as in (11-1), (11-2), and (11-3) above.

However, as the length information, a difference between the lower limit size X or the upper limit size Y of the range and the component data size itself is encoded as shown below depending on the range of R.

(12-1) R=1 bit: In this case, the length information is not encoded as described in (11) above.

(12-2) 2≦R≦128 (bit): In this case, the same procedure is used as in (3-2) of Integer type or (7-2) of OctetString type, the difference of size as the length information is encoded with a minimum bit number that can be represented and set to the bit field. The minimum bit number that can be represented is determined as shown in Table 3 depending on the range of R. FIG. 28 shows an encoding example of "BIT STRING (SIZE (0 ... 1))".

(12-3) 129≦R<64K (bit): In this case, as in (3-3) of Integer type or (7-3) of OctetString type described above, the difference of size as the length information is encoded with a minimum octet number that can be represented and set to the octet field. The minimum octet number that can be represented is determined as shown in Table 4.

(13) When a constraint is applied to both the lower limit size X and the upper limit size such as "BIT STRING (SIZE (X ... Y))", but R=Y−X+1≧64K bits:

In this case, since the constraint to the size range is too broad, the constraint is not used as the length information, but the component data size itself is encoded with octet data string and set to the octet field. The component data value (bit data string) itself is encoded selectively using the bit field and the octet field as in (11-1), (11-2), and (11-3) described above. (14) When a constraint is applied to only the lower limit size X but the upper limit is indefinite (Semi-constrained whole number) such as "BIT STRING (SIZE (X ... MAX))":

In this case, since the constraint to the size range is too broad, the constraint is not used as the length information, but the component data size itself is encoded with octet data string and set to the octet field. The component data value (bit data string) itself is set using the bit field and the octet field selectively depending on the size as in (11-1), (11-2), and (11-3) described above.

In BitString type, MIN means zero, for example, "BIT STRING (SIZE (MIN ... MAX))" is the same as "BIT STRING (SIZE (0 ... MAX))".

<Sequence-Of type and Set-Of type>

In Sequence-Of type and Set-Of type, a constraint is applied to a number section indicating the number (0 or more) of repetition components defined.

Then, encoding of the component number is divided into the following (15) to (19) depending on the constraint applied.

(15) In any of Sequence-Of type and Set-Of type, when the component number is constrained to zero size (upper limit size is zero), encoding is meaningless and is not made.

(16) When a constraint of a single size or fixed number is applied, such as "SEQUENCE SIZE(X) OF" or "SET SIZE (X) OF" where the lower limit size is equal to the upper limit size, since the component number is obvious from the abstract syntax, it is not encoded, but the component data itself is encoded according to the encoding rules of the individual types.

(17) When a constraint is applied to both the lower limit number and the upper limit number (constrained whole number) of range such as "SEQUENCE SIZE (X ... Y) OF" or "SET SIZE (X ... Y) OF", and R=Y−X+1<64K ($2^{26}$):

In this case, as the length information of the component number, a difference between the lower limit number X or the upper limit number Y and the component number itself of Sequence-Of type or Set-Of type is encoded as shown below depending on the range of R. However, the individual component itself is encoded according to the individual type and its encoding rules.

(17-1) R=1: In this case, as described in (16) above, the component number of Sequence-Of type or Set-Of type is not encoded.

(17-2) $2 \leq R \leq 128$: In this case, using the same procedure as in (3-2) of Integer type, (7-2) of OctetString type, or (12-2) of BitString type, the difference of size as the length information is encoded with a minimum bit number that can be represented and set to the bit field. The bit number is determined as shown in Table 3 depending on the range of R.

(17-3) $129 \leq R < 64K$: In this case, as in (3-3) of Integer type described above, the difference of size as the length information is encoded with a minimum octet number that can be represented and set to the octet field. The octet number is determined as shown in Table 4 depending on the range of R.

(18) When a constraint is applied to both the lower limit number X and the upper limit number such as "SEQUENCE SIZE (X ... Y) OF" or "SET SIZE (X ... Y) OF", but $R=Y-X+1 \geq 64K$: In this case, since the constraint to the size range is too broad, the constraint is not used as the length information, but the component number itself is encoded with octet data string and set to the octet field. Each component itself is of course encoded according to the encoding rules of each type.

(19) When a constraint is applied to only the lower limit number X but the upper limit is indefinite such as "SEQUENCE SIZE (X ... MAX) OF" or "SET SIZE (X ... MAX) OF": In this case, since the constraint to the component number is too broad, the constraint is not used as the length information, but the component number itself of Sequence-Of type or Set-Of type is encoded with octet data string and set to the octet field. Each component itself is of course encoded according to the encoding rules of each type.

Also in Sequence-Of type or Set-Of type, MIN means zero, for example, "SET SIZE (MIN ... Y) OF" is the same as "SET SIZE (0 ... Y) OF".

<Evaluation test results when constraint of sub-type is used>

Evaluation test results when constraint of sub-type is used will be described with reference to FIG. 29 and Table 5. In the test, an encoding/decoding program (compiler) produced from the abstract syntax was used to measure the encoding time, decoding time, and encoding data length. Further, as the abstract syntax, an abstract syntax Eg1 with no sub-type and an abstract syntax Eg2 with a sub-type were used. In this evaluation test, NEWS 3860 was used as the computer for measurement.

TABLE 5

(Evaluation test result)

| Abstract syntax | Encoding time (msec) | Decoding time (msec) | Data length (octet) |
| --- | --- | --- | --- |
| Eg1 in FIG. 29 (no sub-type) | 0.12 | 0.06 | 421 |
| Eg2 in FIG. 29 (with sub-type) | 0.07 | 0.02 | 340 |

As can be seen from the test results in Table 5, the encoding time and the decoding time of the efficient packed encoding method (Eg2) using a sub-type are respectively 1.7 times and 3.0 times higher in speed compared to the case (Eg1) using no sub-type. Further, the encoding data length is reduced by a factor of 0.8.

In the efficient packed encoding using a sub-type, as understood from the above description, when the range of value of Integer type is constrained to $2 \leq R \leq 128$, when the range of size of OctetString type or BitString type is constrained to $2 \leq R \leq 128$, and when the range of number of repetition components of Sequence-Of type or Set-Of type is constrained to $2 \leq R \leq 128$, these value, size, and number are encoded with bit data string, and set to the bit field.

Further, when the components using the bit field are selected components of Choice type, optional components of Sequence type or Set type, or repetition components of Sequence-Of type or Set-Of type, since the length of bit field is not determined from the abstract syntax definition, offset field is added to set the length information of the bit field.

With the first version of the present invention, encoding data of values corresponding to the individual types of ASN.1 abstract syntax definition are separated into components as bit data and components as octet data, which are separately packed individually in the order of the abstract syntax definition into the bit field and octet field in the encoding data structure, and padding is made on the bit field to set an octet boundary for subsequent octet field. This eliminates the problems with the prior art Packed Encoding Rules (PER) for ASN.1, increase in processing time due to frequent shift operation and logical AND operation and increase in encoding data length due to padding on bit data of the individual types. This also simplifies the transfer syntax.

In this case, length information of the bit field is required to distinguish the bit field from the octet field. However, when the length of the bit field cannot be statically determined from the abstract syntax of ASN.1, offset field is added to set the length of bit field. This eliminates redundancy to always add the offset field.

In the second and third versions of the present invention, since values of Integer type are encoded with a minimum number of octets, redundancy can be precluded compared to PER.

In the fourth version of the present invention, of values of BitString type, since an extra bit when the length is not an integer multiple of 8 bits is set to the bit field, and others are set to the octet field, the encoding data length can be reduced.

In the fifth version of the present invention, since the preamble showing the use of optional and default in Sequence type and Set type is set to the bit field, padding is reduced compared to PER, thereby reducing the encoding data length.

In the sixth version of the present invention, since the index showing components selected in Choice type is set to the bit field, padding is also reduced compared to PER, thereby reducing the encoding data length.

In the ninth version of the present invention, the length of the offset field can be minimized, preventing the encoding data length from increasing.

The tenth version of the present invention utilizes constraint added to the value of type by the definition of sub-type, for example, the range of value of Integer type, the range of octet length (size) of the component data (octet string) of OctetString type, the range of bit length (size) of the component data (bit string) of BitString type, and the range of repetition number of components of Sequence-Of type or Set-Of type, thereby reducing the encoding data length even more efficiently.

In particular, the eleventh version of the present invention is an embodiment of the tenth version, in which when the value is constrained to a single value, since the value itself is obvious, it is not encoded to achieve packing. Further, when the value is constrained to a range including 2 or more kinds of value, a difference between the lower limit value and the upper limit value is encoded to convert the encoding object to a small value including zero, thereby reducing the encoding data length.

The twelfth to fourteenth versions of the present invention are further embodiments of the eleventh version, in which encoding is made depending on whether or not both the lower limit value and the upper limit value are present in the range of constraint, and on the size of the difference itself to make optimal encoding, thereby reducing the encoding data length even further.

The fifteenth version of the present invention is an embodiment of the tenth version for OctetString type, in which when the component data size is constrained to zero, encoding is not made, and when the component data size is constrained to a single value, since the size itself is obvious, only the component data is encoded, but the length information is not encoded, thereby reducing the encoding data length.

The sixteenth version of the present invention is an embodiment of the eleventh version for BitString type, in which when the component data size is constrained to zero, encoding is not made, and when the size is constrained to a single size, since the length information is obvious, only the component data is encoded, thereby reducing the encoding data.

Further, in the sixteenth version, when the size is constrained to a range including 2 or more kinds of size, depending on whether or not both the lower limit size and the upper limit size are present in the range, and on the size of the range, the component data size itself or a difference between the lower limit size or the upper limit size of the range and the component data size is selected as the length information and optimally encoded to reduce the encoding data length even further.

The seventeenth version of the present invention is an embodiment of the sixteenth version for encoding of the component data value (bit string), in which the octet field and the bit field are selectively used to set the component data value, thereby reducing the encoding data length.

The eighteenth version of the present invention is n embodiment of the sixteenth version for encoding of the difference of size, in which the bit field and the octet field are selectively used according to the size of the difference, thereby reducing the encoding data length even further.

The nineteenth version of the present invention is an embodiment of the tenth version for Sequence-Of type or Set-Of type, in which when the number of repetition components is constrained to zero, encoding is not made, and when the number is constrained to a single number, since the length information is obvious, it is not encoded, but only the component is encoded, thereby reducing the encoding data length.

Further, in the nineteenth version, when the number of repetition components is constrained to a range including 2 or more kinds of number, depending on whether or not both the lower limit size and the upper limit size are present in the range, and on the size of the range, the number of repetition components itself or a number between the lower limit number or the upper limit number and the number of repetition components is selected as the length information and optimally encoded to reduce the encoding data length even further.

The twentieth version of the present invention is an embodiment of the nineteenth version for encoding of the difference of the component number, in which the bit field and the octet field are selectively used depending on the size of the range to encode the difference, thereby reducing the encoding data length even further.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An efficient packed encoding method for ASN.1 for encoding values to each type of abstract syntax definition, comprising:

arranging encoding data into three fields including a bit field, an octet field following the bit field, and an offset field selectively added before the bit field;

in the bit field, providing bit data in a unit of bit in the order of abstract syntax definition;

in the octet field, providing octet data in a unit of octet in the order of abstract syntax definition;

in the offset field, providing bit field length information and, in the bit field, padding the bit field so that a total length of the offset field and the bit field is an integer multiple of 8 bits; and adding the offset field when the length of the bit field is not determined from the abstract syntax definition.

2. The efficient packed encoding method for ASN.1 as claimed in claim 1, further comprising:

when the value in Integer type is within a range from −32 to 31, allocating 2 bits to the length information, and encoding the value with 1 octet including the length information to be set to the octet field; and when the value in Integer type if −33 or less or 32 or more, encoding the value with 2 octets or more including the length information to be set to the octet field.

3. The efficient packed encoding method for ASN.1 as claimed in claim 2, further comprising:

when the value in Integer type is within a range from $-2^{35}$ to −33, and from 32 to $2^{35}-1$, encoding the value with 2 to 5 octets including the length information; and when the value in Integer type is $-(2^{35}+1)$ or less and $2^{35}$ or more, encoding the value with 6 octets including the length information.

4. The efficient packed encoding method for ASN.1 as claimed in claim 1, further comprising:

when a length of the value in BitString type is not an integer multiple of 8 bits, providing extra bits in the bit field; and when the length of the value in BitString type is an integer multiple of 8 bits and when the length of value in BitString type is not an integer multiple of 8 bits, using the octet field for a portion other than extra bits.

5. The efficient packed encoding method for ASN.1 as claimed in claim 1, wherein the bit field is used for information as to whether or not optional and default are used in Sequence type and Set type.

6. The efficient packed encoding method for ASN.1 as claimed in claim 1, wherein the bit field used for information showing components is selected in Choice type.

7. The efficient packed encoding method for ASN.1 as claimed in claim 1, further comprising:

adding the offset field when the type is BitString type, when an optional bit data is included in Sequence type and Set type, when a bit data is included in components in Choice type, and when the type of component in Sequence type and Set-Of type is bit data.

8. The efficient packed encoding method for ASN.1 as claimed in claim 1, further comprising:

using the bit field of a Boolean type, when the value in Enumerated type is within a range from 2 to 128, for extra bit when the length of value in BitString type is not an integer multiple of 8 bits, for preamble of Sequence type and Set type, and when the index in Choice type is within a range from 2 to 128; and using the octet field when the value in Enumerated type is 129 or more, when the type is Integer type, Real type, OctetString type, CharacterString type, Objectidentifier type, Any type, or BitString type in which the length of value is a multiple of 8 bits, for a part other than extra bit when the length of value in BitString type is not an integer multiple of 8 bits, when the value is 129 or more in the index in Choice type, and for a number part showing the number of repetition components in Sequence-Of type and Set-Of type.

9. The efficient packed encoding method for ASN.1 as claimed in any one of claim 1 to claim 8, comprising:

when the total bit number of bit data is 1 bit to 7 bits, allocating 1 bit to the offset field, and a specific bit data is set as a length information of the bit field;

when the total bit number of bit data is 0 bit and 1 octet to 63 octets, allocating 1 octet to the offset field, a specific bit data is set to the first and second bit (2 bits) thereof as length information of the bit field, and the octet number of bit field is set to the remaining 6 bits; and when the total bit number of bit data is 64 octets or more, allocating 2 octets or more to the offset field, a specific bit data is set to the first and second bit (2 bits) of the first octet thereof, an octet number after the second octet is set to the remaining 6 bits, and octet number of the bit field is set to after the second octet.

10. The efficient packed encoding method for ASN.1 as claimed in claim 1, wherein a value of each type of abstract syntax definition is encoded as an encoding object according to a constraint defined by a sub-type.

11. The efficient packed encoding method for ASN.1 as claimed in claim 10 wherein the encoding object is a value of Integer type;

when said constraint constrains the value of Integer type to a single value, encoding is not performed;

when said constraint constrains the value of Integer type to a range including two or more kinds of value, encoding a difference between a lower limit value or an upper limit value of the range and the value of Integer type.

12. The efficient packed encoding method for ASN.1 as claimed in claim 11, wherein only one of the upper limit value or the lower limit value of the range is present but the other is not present, when the difference is 0 or more and 63 or less, allocating 2 bits to the length information, and encoding the difference with 1 octet including the 2 bits of the length information;

when the difference if 64 or more and $2^{36}-1$ or less, encoding the difference with 2 to 5 octets including the length information; and when the difference is $2^{36}$ or more, encoding the difference with 6 octets or more including the length information.

13. The efficient packed encoding method for ASN.1 as claimed in claim 11, wherein when both the upper limit value and the lower limit value are present in the range, and the range includes 2 to $2^{16}$ kinds of values, when the range includes 2 to 128 kinds of values, the length information is not encoded, and only the difference is encoded with bit data and set to the bit field; and when the range includes 129 to $2^{16}$ kinds of values, the length information is not encoded, and only the difference is encoded with octet data and set to the octet field.

14. The efficient packed encoding method for ASN.1 as claimed in claim 11, wherein when both the upper limit value and the lower limit value are present in the range, and range includes more than $2^{16}$ kinds of values:

when the difference is 0 to 63, 2 bits is allocated to the length information, encoding the difference with 1 octet including the 2 bits of the length information;

when the difference is 64 to $2^{36}-1$, encoding the difference with 2 to 5 octets including the length information; and when the difference is $2^{36}$ or more, encoding the difference with 6 or more octets including the length information.

15. The efficient packed encoding method for ASN.1 as claimed in claim 10, wherein the encoding object is a component data value of OctetString type;

when the constraint constrains the component data size of OctetString type to zero, the component data value and the length information are not encoded;

when the constraint constrains the component data size to a single size, encoding only the component data value and set to the octet field, but the length information is not encoded;

when the constraint constrains the component data size to a range including 2 to 128 kinds of size, encoding the component data value set to the octet field, and a difference between the lower limit size or the upper limit size of the range and the component data size as length information is encoded with bit data and set to the bit field;

when the constraint constrains the component data size to a range including 129 or more to less than $2^{16}$ kinds of size, encoding the component data value set to the octet field, and the difference between the lower limit size or the upper limit size of the range and the component data size as length information is encoded with octet data and set to the octet field; and when the constraint constrains the component data size to a range including more than $2^{16}$ kinds of size, or a range where only the lower limit size is present and the upper limit size is not present, encoding the component data value set to the octet field, and the component data size as length information is encoded with octet data and set to the octet field.

16. The efficient packed encoding method for ASN.1 as claimed in claim 10, wherein the encoding object is a component data value of BitString type:

when the constraint constrains the component data size of BitString type to zero, the component data value and the length information are not encoded;

when the constraint constrains the component data size to a single size, encoding only the component data value, but the length information is not encoded;

when the constraint constrains the component data size to a range including 2 to less than $2^{16}$ kinds of size, in addition to encoding the component data size, encoding a difference between the lower limit size or the upper limit size and the component data size as length information is encoded; and when the constraint constrains the component data size to a range including $2^{16}$ or more kinds of size, or when only the lower limit size is present but the upper limit size is not present, in addition to encoding the component data value, encoding the component data size itself as length information with octet data and set to the octet field.

17. The efficient packed encoding method for ASN.1 as claimed in claim 16, wherein when the component data size is 8 or more bits and an integer multiple of 8, setting the component data value to the octet field;

when the component data size is less than 8 bits, setting the component data value; and when the component data size is not an integer multiple of 8 exceeding 8 bits, of the component data value, a part which can be arranged in units of octet is set to the octet field, and a fraction in units of octet is set to the bit field.

18. The efficient packed encoding method for ASN.1 as claimed in claim 16, wherein as encoding of the difference between the lower limit size or the upper limit size and the component data size;

when the range includes 2 to 128 kinds of size, encoding the difference with bit data and set to the bit field; and when the range includes 129 to less than $2^{16}$ kinds of size, encoding the difference is encoded with octet data and set to the octet field.

19. The efficient packed encoding method for ASN.1 as claimed in claim 10, wherein the encoding object is a component data of Sequence-Of type or Set-Of type;

when the constraint constrains the component number to zero, the component and the number thereof are not encoded;

when the constraint constrains the component number to a single number, encoding only the component according to PER of the type, but the component number is not encoded;

when the constraint constrains the component number to a range including 2 to less than $2^{16}$ kinds of number, encoding the individual components according to encoding rule of the individual types, and a difference between the lower limit number or the upper limit number and the component number of the range, in place of the component number, is encoded; and when the constraint constrains the component number to a range including $2^{16}$ or more kinds of number, or a range where only the lower limit number is present but the upper limit number is not present, encoding the individual components according to encoding rule of the individual types, and the component number itself is encoded with octet data and set to the octet field.

20. The efficient packed encoded method for ASN.1 as claimed in claim 19, wherein when the difference between the lower limit number or the upper limit number of the range and the component number is encoded;

when the range includes 2 to 128 kinds of number, encoding the difference with bit data and set to the bit field; and when the range includes 129 to less than $2^{16}$ kinds of number, encoding the difference with octet data and set to the octet field.

* * * * *